United States Patent [19]
Kim et al.

[11] Patent Number: 5,625,604
[45] Date of Patent: Apr. 29, 1997

[54] ADDRESS TRANSITION DETECTION CIRCUIT FOR A MEMORY DEVICE HAVING SIGNAL DELAY CIRCUITRY

[75] Inventors: Yong S. Kim, Kyungki-Do; Yong W. Jeon, Seoul, both of Rep. of Korea

[73] Assignee: LG Semicon Co., Ltd., Cheongju, Rep. of Korea

[21] Appl. No.: 583,392

[22] Filed: Jan. 5, 1996

[30] Foreign Application Priority Data

Oct. 12, 1995 [KR] Rep. of Korea ............... 35146/1995

[51] Int. Cl.⁶ .................................................. G11C 8/00
[52] U.S. Cl. .......................... 365/233.5; 365/230.08; 365/194; 365/189.08; 326/93; 327/175; 327/176
[58] Field of Search .................. 365/233.5, 230.08, 365/194, 189.08; 326/93; 327/175, 176

[56] References Cited

U.S. PATENT DOCUMENTS 5,438,550  8/1995  Kim .................................. 365/233.5

*Primary Examiner*—David C. Nelms
*Assistant Examiner*—Andrew Q. Tran
*Attorney, Agent, or Firm*—Fleshner & Kim

[57] ABSTRACT

An address transition detection circuit for a memory device, by which an address transition detect signal having a pulse width required for operating the memory device is outputted regardless of a pulse width of an address signal inputted to the memory device to thereby prevent any malfunction of the memory device, includes a NOR gate for NORing the inputted address signal and a chip select signal; a latch for latching an output signal of the NOR gate by first to third input delay signals to output first and second latch signals; first and second signal delays for respectively delaying the first and second latch signals provided from the latch for a predetermined time to respectively output first and second delay signals; and a signal output unit for outputting the address transition detect signal in accordance with the first and second latch signals respectively provided from the latch and the first and second delay signals respectively provided from the first and second signal delays.

26 Claims, 9 Drawing Sheets

FIG.7A
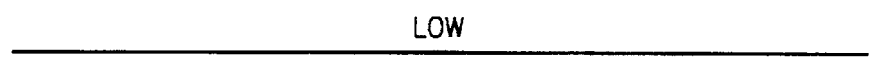
FIG.7B
FIG.7C
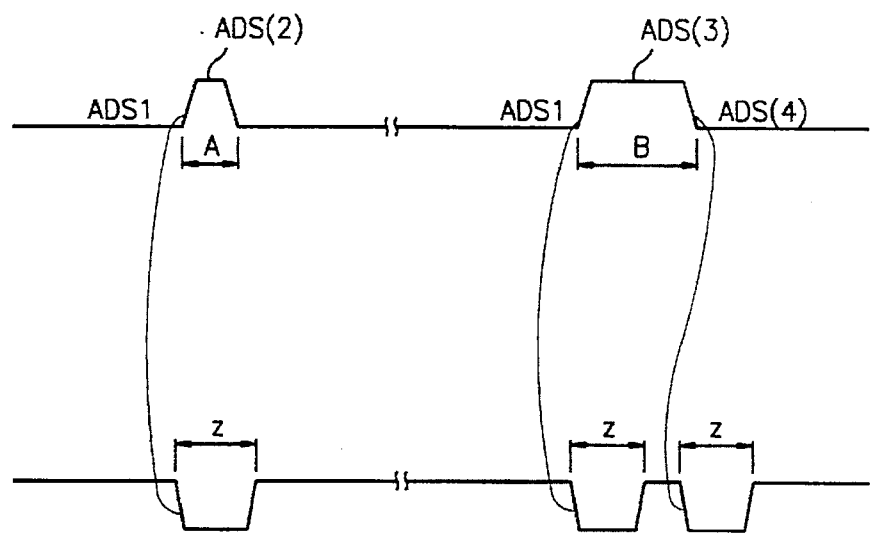

ADDRESS TRANSITION DETECTION CIRCUIT FOR A MEMORY DEVICE HAVING SIGNAL DELAY CIRCUITRY

BACKGROUND OF THE INVENTION

1. Field of the Invention

The present invention relates to an address transition detection circuit for a memory device, and more particularly to an address transition detection circuit in which an address transition detect signal having a pulse width required for operating the memory, device is outputted regardless of a pulse width of an address signal inputted to the memory, device to thereby prevent any malfunction of the memory device.

2. Description of the Prior Art

A conventional address transition detection circuit for a memory device, referring to FIG. 1, includes a NOR gate 1 for NORing an input chip select signal CSb and an input address signal AD: a latch 2 for latching the signal provided from the NOR gate 1 and outputting inverted latch signals LS1 and LS2; signal delays 3 and 4 for delaying the latch signals LS1 and LS2 provided from the latch 2 for a predetermined time and outputting delayed signals DLS1 and DLS2; and a signal outputting unit 5 for outputting an address transition detect signal ATDS in response to the latch signal LS1 and LS2 provided from the latch 2 and the delay signals DLS1 and DLS2 respectively provided from the signal delays 3 and 4.

The latch 2 includes a NAND gate 22 for NANDing both the signal provided from the NOR gate 1 and inverted through an inverter 21 and an input signal LS2 to output the latch signal LS1, and also a NAND gate 23 for NANDing the signals respectively provided from both the NOR gate 1 and the signal LS1 from the NAND gate 22 to output the latch signal LS2.

The signal delay 3 includes inverters 31 and 32 for sequentially inverting the latch signal LS1 provided from the latch 2, and the signal delay 4 includes inverters 41 and 42 for sequentially inverting the latch signal LS2 provided from the latch 2.

The signal outputting unit 5 includes a PMOS transistor MP1 having a source to which a power supply voltage VCC is applied and a gate to which the delayed signal line DLS1 from the signal delay 3 is applied; a PMOS transistor MP2 having a source to which the drain of the PMOS transistor MP1 is connected and a gate to which the latch signal LS1 from the latch 2 is applied and a drain connected to an address transition detect signal ATDS output line; an NMOS transistor MN1 having its drain connected in common with the drain of PMOS transistor MP2, and also having its gate connected in common with the gate of PMOS transistor MP2; an NMOS transistor MN2 having a drain to which a source of the NMOS transistor MN1 is connected, a gate to which the delay signal DLS2 from the signal delay 4 is applied, and a source connected to ground; a PMOS transistor MP3 having a source to which the power supply voltage VCC is applied, a gate to which the gate of the NMOS transistor MN2 is connected; a PMOS transistor MP4 having a source to which a drain of the PMOS transistor MP3 is connected, a gate to which the latch signal LS2 from the latch 2 is applied and a drain connected to the address transition detect signal ATDS output line; an NMOS transistor MN3 having its drain connected in common with the drain of PMOS transistor MP4 and also having its gate connected in common with the gate of PMOS transistor MP4; and an NMOS transistor NM4 having a drain to which a source of the NMOS transistor MN3 is connected, a gate to which the gate of the PMOS transistor MP1 is connected, and a source connected to ground.

The operation of the conventional address transition detection circuit for a memory device as constructed above will now be described.

At an initial stage, when a low level chip select signal CSb and a low level address signal AD are inputted, the NOR gate 1 outputs a high level signal after NORing the inputted signals CSb and AD.

Then, the NAND gate 22 of the latch 2 receives at one input terminal thereof the signal provided from the NOR gate 1 and inverted as a low level signal through the inverter 21, and outputs a high level latch signal LS1 regardless of a state of the signal provided from the NAND gate 23 and applied to the other input terminal thereof.

The NAND gate 23 receives at one input terminal thereof the high level signal provided from the NOR gate 1 and at the other input terminal thereof the high level latch signal LS1 provided from the NAND gate 22, NANDing the high level signal and the high level latch signal LS1, to output a low level latch signal LS2.

The high level latch signal LS1 provided from the NAND gate 22 is delayed for a predetermined time by sequentially passing through the inverters 31 and 32 of the delay 3 so as to be outputted as a high level delay signal DLS1, while the low level latch signal LS2 provided from the NAND gate 23 is delayed for a predetermined time by sequentially passing through the inverters 41 and 42 of the delay 4 so as to be outputted as a low level delay signal DLS2.

Then, the PMOS transistor MP1 and the NMOS transistor MN4 of the signal output unit 5 receive the high level signal DLS1 provided sequentially through the inverters 31 and 32 so as to be turned off and turned on, respectively, while the PMOS transistor MP2 and the NMOS transistor MN1 commonly receive at each gate thereof the high level latch signal LS1 provided from the NAND gate 22 so as to be turned off and turned on, respectively.

In the meantime, the NMOS transistor MN2 and the PMOS transistor MP3 receive at each gate thereof the low level signal DLS2 provided sequentially through the inverters 41 and 42 so as to be turned off and turned on, respectively, while the PMOS transistor MP4 and the NMOS transistor MN3 commonly receive at each gate thereof the low level latch signal LS2 provided from the NAND gate 23 so as to be turned on and turned off, respectively.

Accordingly, a high level address transition detect signal ATDS is outputted through the address transition detect signal ATDS output line.

Thereafter, under the condition that a low level address signal AD is transitted to a high level address signal AD, when a pulse width of the address signal AD transitted to the high level signal is longer than a pulse width of an address transition detect signal required for operating the memory device, the high level address signal AD having the pulse width is inputted, with which when a low level chip select signal CSb is inputted, the NOR gate 1 outputs a low level signal by NORing the inputted signals CSb and AD.

Then, the NAND gate 23 receives at one input terminal thereof the low level signal provided from the NOR gate 1, NANDing it with the high level signal LS1 applied to the other input terminal thereof, to output a high level signal LS2, while the NAND gate 22 receives at one input terminal thereof the high level signal inverted through the inverter 21 and at the other input terminal thereof the high level signal LS2 provided from the NAND gate 23, NANDing the high level signals, to output a low level signal LS1.

Accordingly the PMOS transistor MP2 and the NMOS transistor MN1 commonly receive at each gate thereof the low level signal LS1 provided from the NAND gate 22 so as to be turned on and turned off, respectively, while the PMOS transistor MP4 and the NMOS transistor MN3 commonly receive at each gate thereof the high level signal LS2 provided from the NAND gate 23 so as to be turned off and turned on, respectively.

And, the PMOS transistors MP1 and MP3 and the NMOS transistors MN2 and MN4 are maintained at their immediately preceding switched conditions until the signals LS1 and LS2 respectively provided from the NAND gates 22 and 23 are outputted after passing the delays 3 and 4, so that the high level signal ATDS being provided through the address transition detect signal ATDS output line is transitted to be outputted as a low level signal.

Thereafter, when a low level signal DLS1 is outputted sequentially through the inverters 31 and 32 and a high level signal DLS2 is outputted through the inverters 41 and 42, the PMOS transistor MP1 and the NMOS transistor MN4 receive at each gate thereof the output low level signal DLS1 so as to be turned on and turned off, respectively, while the NMOS transistor MN2 and the PMOS transistor MP3 receive at each gate thereof the outputted high level signal DLS2 so as to be turned on and turned off, respectively.

Since the PMOS transistors MP2 and MP4 and the NMOS transistors MN1 and MN3 are maintained at their immediately preceding switched conditions, the low level address transition detect signal ATDS being provided through the address transition detect signal ATDS output line is transitted to a high level signal to be outputted.

Thereafter, when the high level address signal AD is transitted to the low level address signal AD to be inputted and the low level chip select signal CSb is inputted, the NOR gate 1 outputs a high level signal after NORing the inputted signals AD and CSb.

Then, the NAND gate 23 receives at one input terminal thereof the high level signal provided from the NOR gate 1, NANDing it with the low level signal LS1 applied to the other input terminal thereof, to output a high level signal LS2, while the NAND gate 22 receives at one input terminal thereof the low level signal inverted through the invertor 21 and at the other input terminal thereof the high level signal LS2 provided from the NAND gate 23, NANDing the low level signal and the high level signal LS2, to output a high level signal LS1.

Accordingly, the NAND gate 23 receives at the other input terminal thereof the high level signal LS1 from the NAND gate 22, NANDing it with the high level signal applied to one input terminal thereof, to output a low level signal LS2.

Therefore, the PMOS transistor MP2 and the NMOS transistor MN1 commonly receive at each gate thereof the high level signal LS1 provided from the NAND gate 22 so as to be turned on and turned off, respectively, while the PMOS transistor MP4 and the NMOS transistor MN3 commonly receive at each gate thereof the low level signal LS2 provided from the NAND gate 23 so as to be turned on and turned off, respectively.

And, since the PMOS transistors MP1 and MP3 and the NMOS transistors MN2 and MN4 are maintained at their immediately preceding switched conditions until the signals LS1 and LS2 respectively provided from the NAND gates 22 and 23 are outputted, respectively, the high level address transition detect signal ATDS being provided through the address transition detect signal ATDS output fine is transitted to be outputted as a low level address transition detect signal ATDS.

Thereafter, when the high level signal LS1 provided from the NAND gate 22 is delayed for a predetermined time after sequentially passing through the inverters 31 and 32 to be outputted as a high level signal DLS1 and a low level signal LS2 provided from the NAND gate 23 is delayed for a predetermined time after sequentially passing through the inverters 41 and 42 to be outputted as a low level signal DLS2, the PMOS transistor MP1 and the NMOS transistor MN4 receive at each gate thereof the high level signal DLS1 provided from the inverter 32 so as to be turned on and turned off, respectively, while the NMOS transistor MN2 and the PMOS transistor MP3 receive at each gate thereof the low level signal DLS2 provided from the inverter 42 so as to be turned off and turned on, respectively.

Since the PMOS transistors MP2 and MP1 and the NMOS transistors MN1 and MN3 are maintained at their immediately preceding switched conditions, the low level address transition detect signal ATDS provided through the address transition detect signal ATDS output line is transitted to a high level address transition detect signal to be outputted.

Consequently, when the address signal AD is transitted from a low level signal to a high level signal, the pulse width of the address transition detect signal ATDS is determined according to the delay time of the signal delay 3, while when the address signal AD is transitted from a low level to a high level, the pulse width of the address transition detect signal ATDS is determined according to the delay time of the signal delay 4.

In the meantime, when the address signal AD having a pulse width shorter than that of the high level address transition detect signal ATDS required for operating the memory device is inputted and the low level chip select signal CSb is also inputted, the address transition detection circuit is operated in the same manner as described above, so that a low level address transition detect signal ATDS is outputted through the address transition detect signal ATDS output line which has a pulse width shorter than that of the address transition detect signal required for operating the memory device.

However, in the conventional address transition detection circuit for the memory device, when an address signal is inputted having a pulse width shorter than that according to a delay time of a signal delay, that is, a pulse width shorter than that of the address transition detect signal required for operating the memory device, an address transition detect signal having the same pulse width as that of the inputted address signal is outputted to the memory device, causing a problem that an operation of the memory device is rendered unstable and unreliable.

SUMMARY OF THE INVENTION

Therefore, an object of the present invention is to provide an address transition detection circuit for a memory device in which an address transition detect signal having a pulse width required for operating the memory device is outputted regardless of a pulse width of an address signal provided to the memory device to thereby prevent a malfunction of the memory device.

In order to obtain the above object, there is provided an address transition detection circuit including: a NOR gate for NORing an inputted address signal and an inputted chip select signal: a latch for latching the signal provided from the NOR gate in response to first through third delay signals to output first and second latch signals; first and second delays for delaying the first and second latch signals respectively provided from the latch for a predetermined time to output first and second delay signals, respectively; a signal output unit for outputting an address transition detect signal in response to the first and second latch signals respectively provided from the latch and the first and second delay signals respectively provided from the first and the second delays; a third signal delay for logically operating the first and second latch signals and the first and second delay signals provided to the signal output unit, and delaying and outputting the address transition detect signal provided from the signal output unit.

Also, there is provided another embodiment of an address transition detection circuit to obtain the above object according to the present invention including: a NOR gate for NORing an inputted address signal and an inputted chip select signal; a latch for latching a signal provided from the NOR gate in response to first through third delay signals to output first and second latch signals; first and second delays for delaying the first and second latch signals respectively provided from the latch for a predetermined time to respectively output the first and second delay signals; a logical operation unit for logically operating the first and second latch signals respectively provided from the latch to output an address transition detect signal; a third signal delay for logically operating the first and second latch signals provided to the logical operation unit and the first and second signals respectively provided from the first and second delays, and outputting the third delay signal in order to delay the address transition detect signal provided from the logical operation unit.

BRIEF DESCRIPTION OF THE DRAWINGS

FIGS. 7A to 7C show input and output waveforms in each part of the circuit of FIG. 6:

DETAILED DESCRIPTION OF THE INVENTION

The present invention will now be described in detail with reference to the accompanying drawings.

Figure 1:
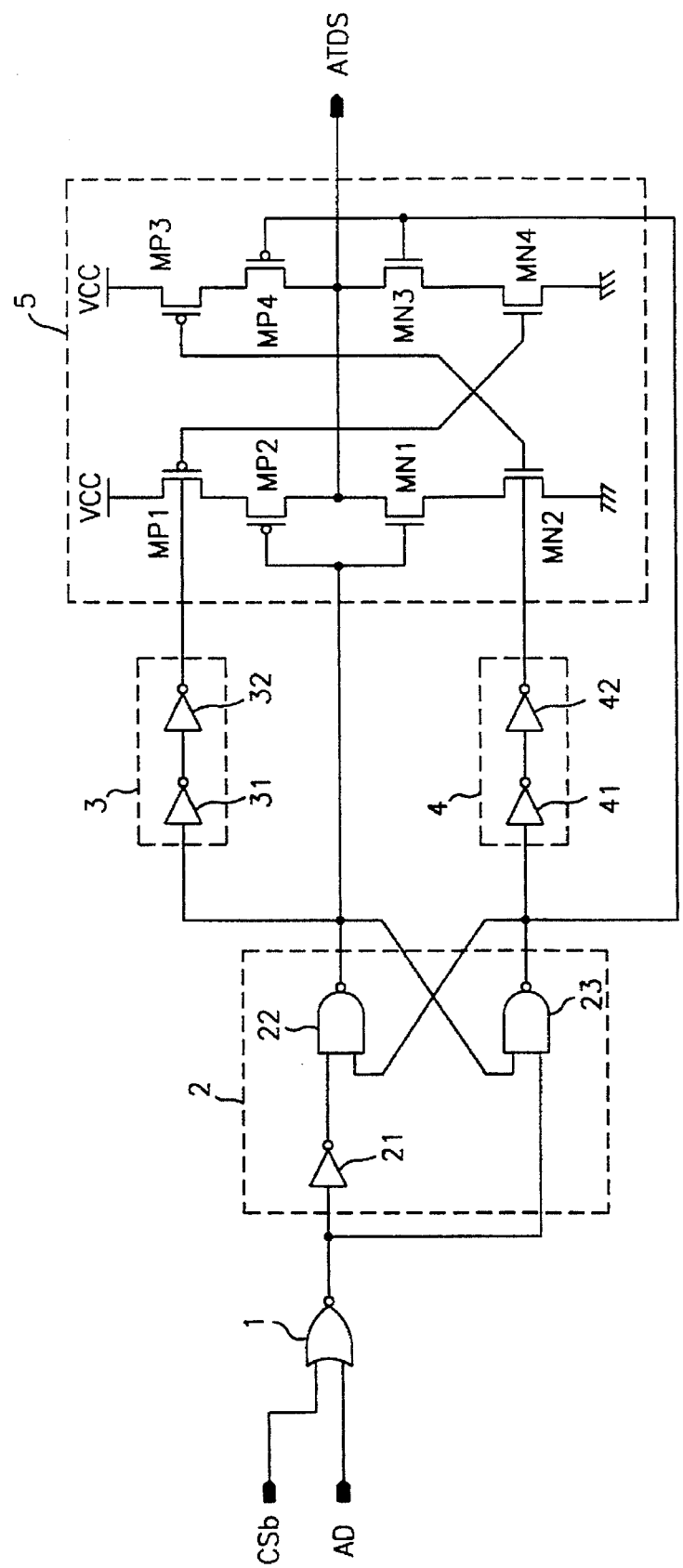
FIG. 1 is a circuit diagram showing an address transition detection circuit of a conventional memory device.
Figure 2:
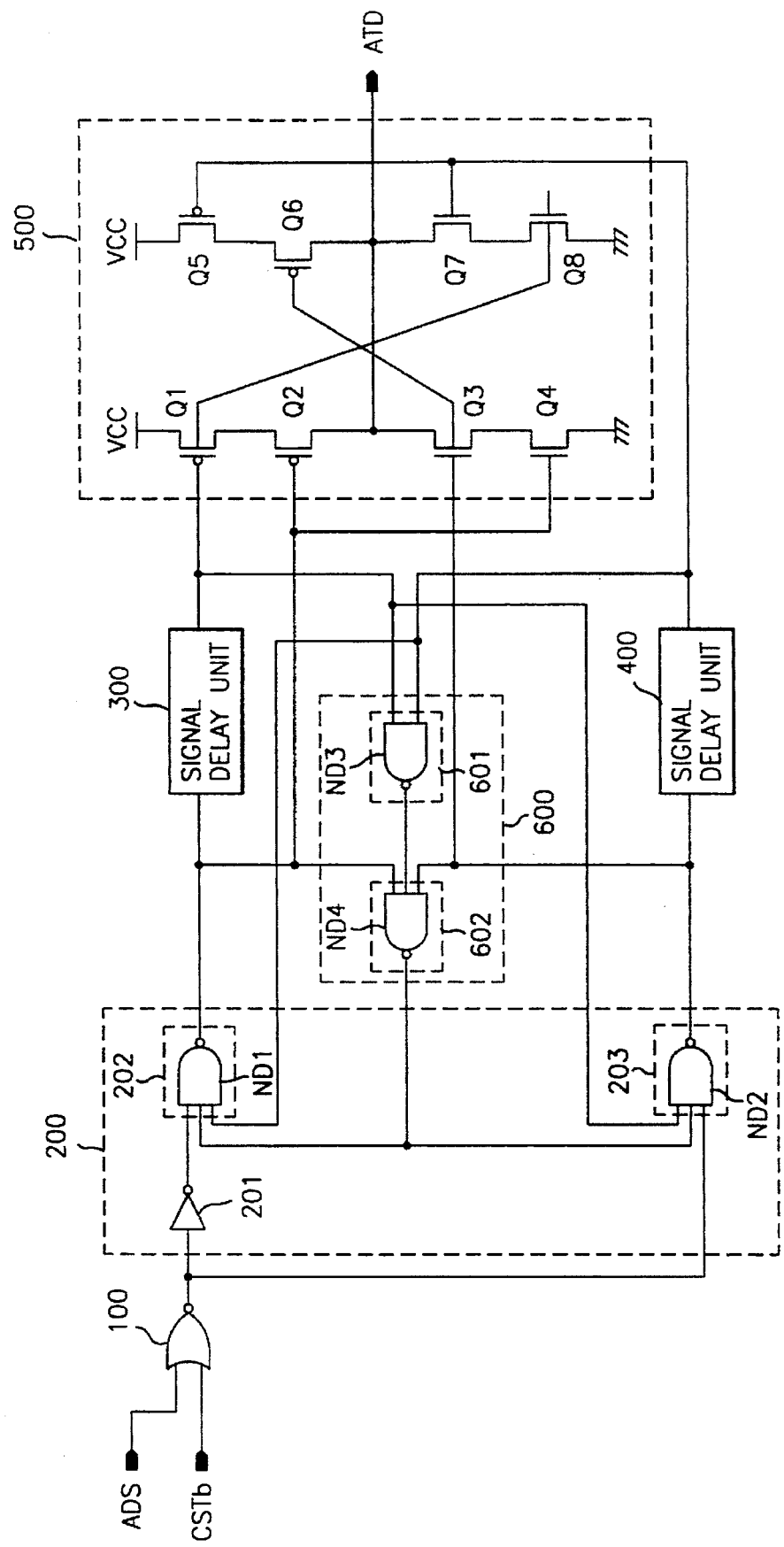
FIG. 2 is a circuit diagram showing an address transition detection circuit for a memory, device according to one embodiment of the present invention.

With reference to FIG. 2, an address transition detection circuit for a memory device according to a first embodiment of the present invention includes a NOR gate 100 for NORing an inputted address signal ADS and a chip select signal CSTb; a latch 200 for latching the output signal of the NOR gate 100 in response to inputted delay signals DS1–DS3 to respectively output latch signals LAS1 and LAS2; signal delays 300 and 400 each for delaying the latch signals LAS1 and LAS2 respectively provided from the latch 200 for a predetermined time to output delay signals DS1 and DS2, respectively; a signal output unit 500 for outputting an address transition detect signal ATD in response to the latch signals LAS1 and LAS2 respectively provided from the latch 200 and the delay signals DS1 and DS2 respectively provided from the signal delays 300 and 400: and a signal delay 600 for logically operating the latch signals LAS1 and LAS2 and the delay signals DS1 and DS2 provided to the signal output unit 500 and outputting a delay signal DS3 to the latch 200 to delay the outputting of the address transition signal ATD provided from the signal output unit 500.

The latch 200 includes a logical operation unit 202 for logically operating the signal provided from the NOR gate 100 and inverted through an inverter 201 and the delay signals DS2 and DS3 respectively provided from the signal delays 400 and 600; and a logical operation unit 203 for logically operating the signal provided from the NOR gate 100 and the delay signals DS1 and DS3 respectively provided from the signal delays 300 and 600.

The signal output unit 500 includes a PMOS transistor Q1 having a source to which a power supply voltage terminal is connected and a gate to which a delay signal DS1 line of the signal delay 300 is connected; a PMOS transistor Q2 having a source to which a drain of the PMOS transistor Q1 is connected and a gate to which a latch signal LAS1 line of the latch 200 is connected; an NMOS transistor Q3 having a drain to which a drain of the PMOS transistor Q2 is connected so as to be connected commonly therewith to an address transition detect signal ATD line and a gate to which a latch signal LAS2 line of the latch 200 is connected; an NMOS transistor Q4 having a drain to which a source of the NMOS transistor Q3 is connected, a gate connected in common with the gate of the PMOS transistor Q2 and a source connected to ground: a PMOS transistor Q5 having a source to which a power supply voltage terminal is connected and a gate to which a delay signal DS2 line of the signal delay 400 is connected; a PMOS transistor Q6 having a source to which a drain of the PMOS transistor Q5 is connected, and a gate connected in common with the gate of the NMOS transistor Q3; an NMOS transistor Q7 having a drain to which a drain of the PMOS transistor Q6 is connected so as to be commonly connected therewith to the address transition detect signal ATD line and a gate commonly connected to the gate of the PMOS transistor Q5; and an NMOS transistor Q8 having a drain to which a source of the NMOS transistor Q7 is connected, a gate commonly connected with the gate of the PMOS transistor Q1 and a source connected to ground.

The signal delay 600 includes a logical operation unit 601 for logically operating the delay signals DS1 and DS2 respectively provided from the signal delays 300 and 400: and a logical operation unit 602 for logically operating an output signal provided from the logical operation unit 601 and the latch signals LAS1 and LAS2 respectively provided from the latch 200.

The logical operation units 202 and 203 include NAND gates ND1 and ND2, respectively, and the logical operation units 601 and 602 include NAND gates ND3 and ND4, respectively.

The operation of the address transition detection circuit for a memory device according to the first embodiment of the present invention as constructed above will now be described in detail with reference to FIGS. 3A to 3C.

Figures 3A, 3B, 3C:
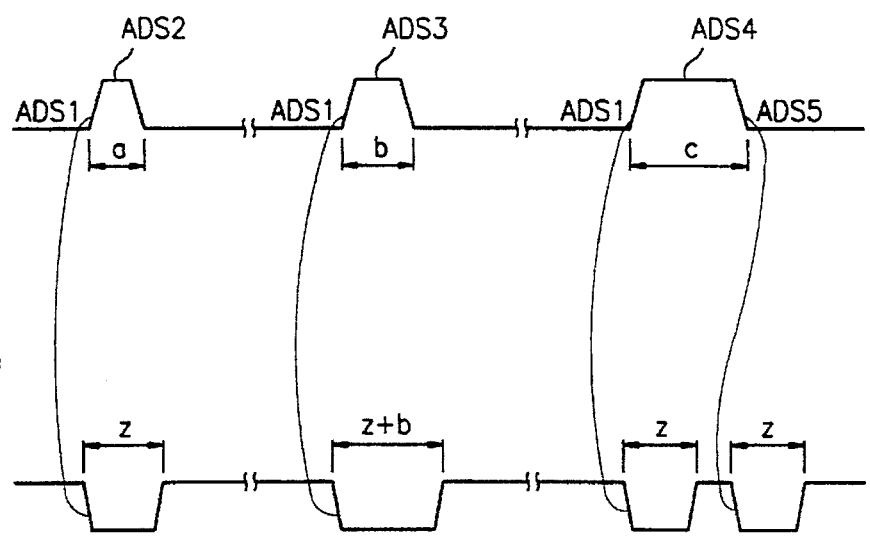
FIGS. 3A to 3C show input and output waveforms in each part of the circuit of FIG. 2.

First, at an initial stage, when a low level chip select signal CSTb shown in FIG. 3A and a low level address signal ADS1 shown in FIG. 3B are respectively inputted to the NOR gate 100, the NOR gate 100 outputs a high level signal after NORing the input signals CSb and ADS1.

The NAND gate ND1 of the logical operation unit 202 receives at a first input terminal thereof a low level signal inverted through the inverter 201 and outputs a high level latch signal LAS1 regardless of a state of delay signals DS2 and DS3 provided to its second and third input terminals, while the NAND gate ND2 receives at a first input terminal thereof the high level signal provided from the NOR gate 100 and outputs a low level latch signal LAS2 or a high level latch signal LAS1 according to the state of delay signals DS1 and DS2 respectively applied to the second and third input terminals thereof.

In this respect, assuming that the low level latch signal LAS2 is outputted from the NAND gate ND2, the signal delays 300 and 400 delay the high level latch signal LAS1 and the low level latch signal LAS2 respectively provided from the NAND gates ND1 and ND2 for a predetermined time, to output a high level delay signal DS1 and a low level delay signal DS2.

Then, the NAND gate ND3 receives at the respective input terminals thereof the high level delay signal DS1 and the low level delay signal DS2 from the signal delays 300 and 400, respectively, NANDing the high level delay signal DS1 and the low level delay signal DS2, to output a high level signal, while the NAND gate ND4 receives at the first and second input terminals thereof the high level latch signal LAS1 and the low level latch signal LAS2 from the NAND gates ND1 and ND2 and at the third input terminal thereof the high level signal from the NAND gate ND3, NANDing the high level latch signal LAS1, the low level latch signal LAS2 and the latter high level signal, to output a high level delay signal DS3.

Accordingly, the NAND gate ND1 receives at the second input terminal thereof the low level delay signal DS2 from the signal delay 400 and at the third input terminal thereof the high level signal DS3 from the NAND gate ND4, NANDing the signals DS2 and DS3 with the low level signal applied to the first input terminal thereof, to output a high level latch signal LAS1, while the NAND gate ND2 receives at the second input terminal thereof the high level delay signal DS1 from the signal delay 300 and at the third input terminal thereof the high level delay signal DS3 from the NAND gate ND4, NANDing the signals DS1 and DS3 with the high level signal applied to the first input terminal thereof, to output a low level latch signal LAS2.

On the other hand, assuming that the high level signal LAS2 is outputted from the NAND gate ND2, the signal delays 300 and 400 delay the high level signals LAS1 and LAS2 provided from the NAND gates ND1 and ND2 for a predetermined time, to output high level delay signals DS1 and DS2.

Then, the NAND gate ND3 receives at both input terminals thereof the high level delay signals DS1 and DS2 from the signal delays 300 and 400, respectively, NANDing them, to output a low level signal, while the NAND gate ND4 receives at first through third input terminals thereof the high level signals LAS1 and LAS2 and the low level signal respectively provided from the NAND gates ND1–ND3, to output a high level delay signal DS3.

Accordingly, the NAND gate ND2 receives at the second input terminal thereof the high level signal DS1 from the signal delay 300 and at the third input terminal thereof the high level signal DS3 from the NAND gate ND4, NANDing the signals DS1 and DS3 with the high level signal applied to the first input terminal thereof, to output a low level latch signal LAS2.

Therefore, the PMOS transistor Q1 and the NMOS transistor Q8 of the signal output unit 500 commonly receive at respective gates thereof the high level signal DS1 from the signal delay 300 to thereby be turned off and turned on, respectively, and the PMOS transistor Q2 and the NMOS transistor Q4 commonly receive at respective gates thereof the high level signal LAS1 from the NAND gate ND1 so as to be turned off and turned on thereby, respectively, while the NMOS transistor Q3 and the PMOS transistor Q6 receive at respective gates thereof the low level signal LAS2 from the NAND gate ND2 so as to thereby be turned off and turned on, respectively.

The PMOS transistor Q5 and the NMOS transistor Q7 receive at respective gates thereof the low level signal DS2 from the signal delay 400 so as to thereby be turned on and turned off, respectively, thereby outputting a high level address transition detect signal ATD through the address transition detect signal ATD line.

Thereafter, when a low level chip select signal CSb shown in FIG. 3A and a high level address signal ADS2 shown in FIG. 3B having a pulse width "a" smaller than one-half of a pulse width "Z" of the address transition detect signal shown in FIG. 3C required for operating the memory device are inputted, the NOR gate 100 outputs a low level signal after NORing the input signals ADS2 and CSb.

Then, the NAND gate ND1 receives at the first input terminal thereof a high level signal from inverter 201, NANDing it with a low level signal DS2 and a high level signal DS3 respectively applied to the second and third input terminals thereof, to output a high level signal LAS1, while the NAND gate ND2 receives at the first input terminal thereof the low level signal from the NOR gate 100, NANDing it with the high level signals DS1 and DS3 respectively applied to the second and third input terminals thereof, to output a high level signal LAS2.

Accordingly, the NMOS transistor Q3 and the PMOS transistor Q6 commonly receive at their gates thereof the high level signal LAS2 from the NAND gate ND2 so as to be thereby turned on and turned off, respectively, while the PMOS transistors Q1, Q2 and Q5 and the NMOS transistor Q4, Q7 and Q8 are maintained at their immediately preceding switched conditions, so that the high level signal ATD provided through the address transition detect signal ATD line is transitted to be output as a low level signal.

At this time, the NAND gate ND3 outputs a high level signal after NANDing the high level signal DS1 and the low level signal DS2 respectively applied to the input terminals thereof, while the NAND gate ND4 receives at the first and second input terminals thereof the high level signals LAS1 and LAS2 from the NAND gates ND1 and ND2, respectively, and at the third input terminal thereof the high level signal from the NAND gate ND3, NANDing the signals LAS1 and LAS2 and the latter high level signal, to output a low level signal DS3.

Then, the NAND gate ND1 receives at the third input terminal thereof the low level signal DS3 from the NAND gate ND4, NANDing it with the high level signal and the low level signal DS2 respectively applied to the first and second input terminals thereof, to output a high level signal LAS1, while the NAND gate ND2 receives at the third input terminal thereof the low level signal DS3 from the NAND gate ND4, NANDing it with the low level signal and the high level signal DS1 respectively applied to the first and second input terminals thereof, to output a high level signal LAS2.

Therefore, the low level signal ATD is continuously outputted through the address transition detect signal ATD line.

Thereafter, when the high level signal LAS2 provided from the NAND gate ND2 is outputted as a high level delay signal DS2 through the signal delay 400, the PMOS transistor Q5 and the NMOS transistor Q7 receive at their gates the high level signal DS2 from the signal delay 400 so as to thereby be turned off and turned on, respectively, while the PMOS transistors Q1, Q2 and Q6 and the NMOS transistors Q3, Q4 and Q8 are maintained at their immediately preceding switched conditions, so that the low level signal ATD is continuously output through the address transition detect signal ATD line.

At this time, the NAND gate ND3 receives at the other input terminal thereof the high level signal DS2 from the signal delay 400, NANDing it with the high level signal DS1 applied to one input terminal thereof, to output a low level signal, while the NAND gate ND4 receives at the third input terminal thereof the low level signal from the NAND gate ND3, NANDing it with the high level signals LAS1 and LAS2 respectively applied to the first and second input terminals thereof, to output a high level signal DS3.

Accordingly, the NAND gate ND1 receives at the second and third input terminals thereof the high level signals DS2 and DS3 respectively from the signal delay 400 and the NAND gate ND4, NANDing them with the high level signal applied to the first input terminal thereof, to output a low level signal LAS1, while the NAND gate ND2 receives at the third input terminal thereof the high level signal DS3 from the NAND gate ND4, NANDing it with the low level signal and the high level signal respectively applied to the first and second input terminals, to output a high level signal LAS2.

Therefore, the PMOS transistor Q2 and the NMOS transistor Q4 commonly receive at their gates the low level signal LAS1 from the NAND gate ND1 so as to thereby be turned on and turned off, respectively, while the PMOS transistors Q1, Q5 and Q6 and NMOS transistors Q3, Q7 and Q8 are maintained at their immediately preceding switched conditions, so that the low level signal ATD is continuously outputted through the address transition detect signal ATD line.

Thereafter, when the low level signal LAS1 provided from the NAND gate ND1 is outputted as a low level delay signal DS1 through the signal delay 300, the PMOS transistor Q1 and the NMOS transistor Q8 commonly receive at their gates the outputted low level signal DS1 so as to thereby be turned on and turned off, respectively, while the PMOS transistors Q2, Q5 and Q6 and the NMOS transistors Q3, Q4 and Q7 are maintained at their immediately preceding switched conditions, so that the high level signal ATD is outputted through the address transition detect signal ADS line.

Consequently, the pulse width of the low level address transition detect signal ATD provided through the address transition detect signal ATD line is determined relying on a delay time of the signal delays 300 and 400 and a logical operating time of the NAND gates ND3 and ND4, and when a high level address signal ADS2 having a pulse width "a" as shown in FIG. 3B is inputted to the address transition detection circuit, a low level address transition detect signal ATD having a pulse width "Z" as shown in FIG. 3C is outputted.

On the other hand, as shown in FIG. 3B, under the condition that a low level address signal ADS1 is transitted to a high level address signal ADS3, if a pulse width "b" of the transitted address signal ADS3 is larger than one-half of the pulse width "Z" of the address transition detect signal required for operating the memory device but smaller than the pulse width "Z" of the address transition detect signal, the high level address signal ADS3 having the pulse width "b" is inputted, by which when a low level chip select signal CSb shown in FIG. 3A is inputted, then the address transition detect circuit is operated in the same way as described above, so that the low level signal ATD having a pulse width "Z+b" shown in FIG. 3C is outputted through the address transition detect signal ATD line.

On the other hand, as shown in FIG. 3B, under the condition that the low level address signal ADS1 is transitted to a high level address signal ADS4, if a pulse width "c" of the transitted address signal ADS4 is larger than the pulse width "Z" of the address transition detect signal required for operating the memory device, the high level address signal ADS4 having the pulse width "c" is inputted, by which when a low level chip select signal CS shown in FIG. 3C is inputted, the address transition detection circuit is operated in the same way as described above, so that the address transition detect signal ATD having the pulse width "Z" as shown in FIG. 3C is outputted.

Thereafter, as shown in FIGS. 3B and 3A, when the high level address signal ADS4 transits to a low level address signal ADS5 to be input and a low level chip select signal CSb is inputted, the NOR gate 100 outputs a high level signal after NORing the input signals ADS5 and CSb.

Then, the NAND gate ND1 receives at the first input terminal thereof a low level signal through the inverter 201, NANDing it with high level signals DS2 and DS3 respectively applied to the second and the third input terminals thereof, to output a high level signal LAS1, while the NAND gate ND2 receives at the first input terminal thereof a high level signal from the NOR gate 100, NANDing it with the low level signal DS1 and the high level signal DS3 respectively applied to the second and third input terminals thereof, to output a high level signal LAS2.

Therefore, the PMOS transistor Q2 and the NMOS transistor Q4 commonly receive at their gates the high level signal LAS1 from the NAND gate ND1 so as to thereby be turned off and turned on, respectively, while the PMOS transistors Q1, Q5 and Q6 and the NMOS transistors Q3, Q7 and Q8 are maintained at their immediately preceding switched conditions, so that the high level signal ATD being provided through the address transition detect signal ATD line is transitted to be outputted as a low level signal ATD.

At this time, the NAND gate ND3 outputs a high level signal after NANDing the low level signal DS1 and the high level signal DS2 respectively applied to the input terminals thereof, while the NAND gate ND4 receives at the first input terminal thereof the high level signal LAS1 from the NAND gate ND1 and at the third input terminal thereof the high level signal from the NAND gate ND3, NANDing the high level signal LAS1 and the latter high level signal with the high level signal LAS2 applied to the second input terminal thereof, to output a low level signal DS3.

Then, the NAND gate ND1 receives at the third input terminal thereof the low level signal DS3 from the NAND gate ND4, NANDing it with the low level signal and the high level signal respectively applied to the first and second input terminals thereof, to output continuously a high level signal LAS1, while the NAND gate ND2 receives at the third input terminal thereof the low level signal DS3 from the NAND gate ND4, NANDing it with the high level signal and the low level signal respectively applied to the first and second input terminals thereof, to output a high level signal LAS2.

Accordingly, the low level signal ATD is continuously outputted through the address transition detect signal ATD line.

Thereafter, when the high level signal LAS1 provided from the NAND gate 202 is outputted as a high level delay signal DS1 through the signal delay 300, the PMOS transistor Q1 and the NMOS transistor Q8 commonly receive at their gates the output high level signal LAS1 so as to thereby be turned on and turned off, respectively, while the PMOS transistors Q2, Q5 and Q6 and the NMOS transistors Q3, Q4 and Q7 are maintained at their immediately preceding switched conditions, so that the low level signal ATD is continuously outputted through the address transition detect signal ATD.

At this time, the NAND gate ND3 receives at one input terminal thereof the high level signal DS1 from the signal delay 300, NANDing it with the high level signal DS2 applied to the other input terminal thereof, to output a low level signal, while the NAND gate ND4 receives at the third input terminal thereof the low level signal provided from the NAND gate ND3, NANDing the low level signal with the high level signals LAS1 and LAS2 respectively applied to the first and second input terminals thereof, to output the high level signal DS3.

Accordingly, the NAND gate ND1 receives at the third input terminal thereof the high level signal DS3 provided from the NAND gate ND4, NANDing the high level signal DS3 with the low level signal and the high level signal DS2 respectively applied to the first and second input terminals thereof, to output a high level signal LAS1, while the NAND gate ND2 receives at the second input terminal thereof the high level signal DS1 provided from the signal delay 300 and at the third input terminal thereof the high level signal DS3 from the NAND gate ND4, NANDing the high level signal DS1 and the high level signal DS3 with the high level signal applied to the first input terminal thereof, to output a low level signal LAS2.

Accordingly, the NMOS transistor Q3 and the PMOS transistor Q6 commonly receive at each gate thereof the low level signal LAS2 provided from the NAND gate ND2 so as to thereby be turned off and turned on, respectively, while the PMOS transistors Q1, Q2 and Q5 and the NMOS transistors Q4, Q7 and Q8 are maintained at their immediately preceding switched conditions, so that the low signal ATD is continuously outputted through the address transition detect signal ATD line.

At this time, the NAND gate ND3 receives at respective input terminals thereof the high level signals DS1 and DS2, NANDing them to output a low level signal, while the NAND gate ND4 receives at the second and third input terminals thereof the low level signal LAS2 and the low level signal respectively from the NAND gate ND2 and the NAND gate ND3, NANDing the low level signal LAS1 and the latter low level signal with the high level signal LAS1 applied to the first input terminal thereof, to output a high level signal DS3, so that the NAND gates ND1 and ND2 respectively, output a high level signal LAS1 and a low level signal LAS2.

Accordingly, the low level signal ATD is continuously outputted through the address transition detect signal ATD line.

Thereafter, when the low level signal LAS2 provided from the NAND gate ND2 is outputted as a low level delayed signal DS2 through the signal delay 400, the PMOS transistor Q5 and the NMOS transistor Q7 commonly receive at their gates the output low level signal DS2 so as to thereby be turned on and turned off, respectively, while the PMOS transistors Q1, Q2 and Q6 and the NMOS transistors Q3, Q4 and Q8 are maintained at their immediately preceding switched conditions, so that the low level signal ATD provided through the address transition detect signal ATD line is transitted to be output as a high level signal ATD.

Therefore, when the address signal ADS4 having the pulse width "c" shown in FIG. 3B is inputted to the address transition detection circuit, the two low level address transition detect signals ATD each having the pulse width "Z" as shown in FIG. 3C are outputted.

Figure 4:
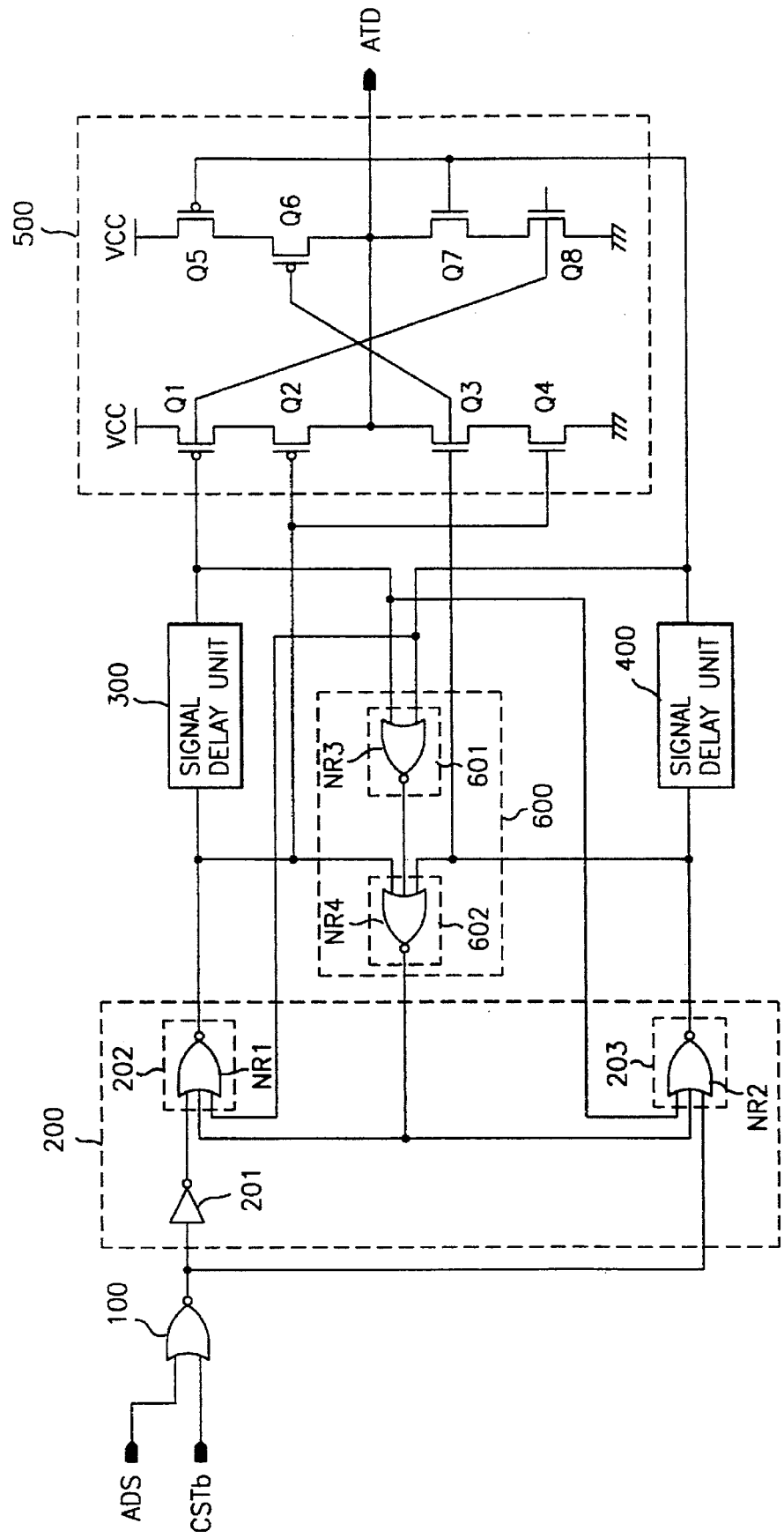
FIG. 4 is a circuit diagram showing an address transition detection circuit for a memory device according to another embodiment of the present invention.

With reference to FIG. 4, an address transition detection circuit for a memory device according to another embodiment of the present invention includes a NOR gate 100; a latch 200 having an inverter 201 and logical operation units 202 and 203; signal delays 300 and 400; a signal output unit 500; and a signal delay unit 600 having logical operation units 601 and 602.

The signal output unit 500 includes a PMOS transistor Q1 having a source to which a power supply voltage VCC terminal is connected and a gate to which a latch signal LAS1 line of the logical operation unit 202 is connected; a PMOS transistor Q2 having a source to which a drain of the PMOS transistor Q1 is connected and a gate to which a latch signal LAS2 line of the logical operation unit 203 is connected; an NMOS transistor Q3 having a drain to which a drain of the PMOS transistor Q2 is connected so as to be commonly connected therewith to an address transition detect signal ATD line, and a gate to which the gate of the PMOS transistor Q1 is connected; an NMOS transistor Q4 having a source to which a source of the NMOS transistor Q3 is connected, a gate to which a delay signal DS2 line of the signal delay 400 is connected, and a source connected to ground; a PMOS transistor Q5 having a source to which the power supply voltage VCC terminal is connected, a gate to which a delay signal DS1 line of the signal delay 300 is connected; a PMOS transistor Q6 having a source to which a drain of the PMOS transistor Q5 is connected and a gate commonly connected with the gate of the NMOS transistor Q4; an NMOS transistor Q7 having a drain to which a drain of the PMOS transistor Q6 is connected so as to be commonly connected therewith to the address transition detect signal ATD line, and a gate commonly connected with the gate of the PMOS transistor Q5: and an NMOS transistor Q8 having a drain to which a source of the NMOS transistor Q7 is connected, a gate commonly connected with the gate of the PMOS transistor Q2 and a source connected to ground.

The logical operation units 202 and 203 include NOR gates NR1 and NR2, respectively, while the logical operation units 601 and 602 include NOR gates NR3 and NR4, respectively.

The operation of the address transition detection circuit for a memory device according to this second embodiment of the present invention will now be described with reference to FIGS. 5A to 5C.

Figures 5A, 5B, 5C:
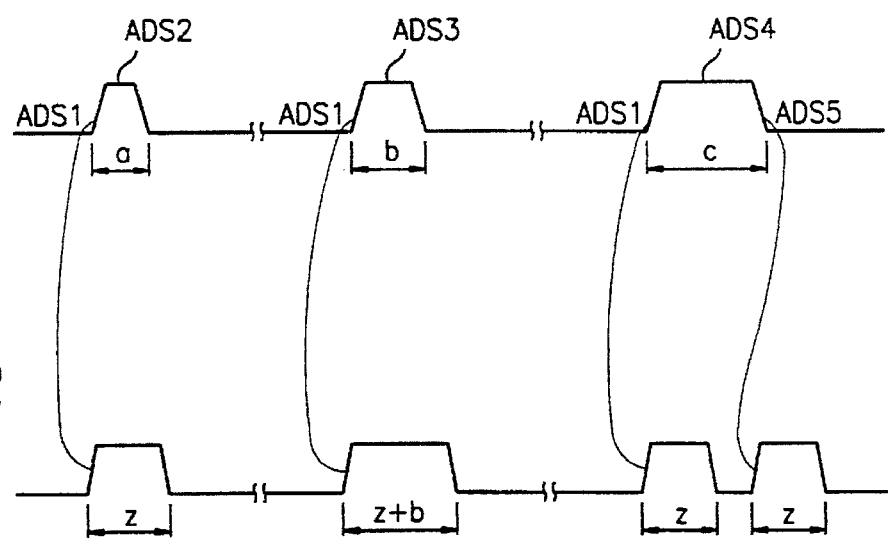
FIGS. 5A to 5C show input and output waveforms in each part of the circuit of FIG. 4.

First, at an initial stage, when a low level chip select signal CSTb as shown in FIG. 5A and a low level address signal ADS1 as shown in FIG. 5B are inputted, the NOR gate 100 outputs a high level signal after NORing the input signals CSb and ADS1.

Then, the NOR gate NR2 receives at a first input terminal thereof the high level signal from the NOR gate 100, to output a low level signal LAS2 regardless of a state of signals applied to second and third input terminals thereof, while the NOR gate NR1 receives at a first input terminal thereof a low level signal inverted through the inverter 201 and outputs a high level signal LAS1 or a low level signal LAS1 according to the state of the signals DS2 and DS3 respectively applied to second and third input terminals thereof.

In this respect, assuming that the high level signal LAS1 is outputted from the NOR gate NR1, the signal delays 300 and 400 delay the high level signal LAS1 and the low level signal LAS2 respectively provided from the NOR gates NR1 and NR2 for a predetermined time, to respectively output a high level delay signal DS1 and a low level delay signal DS2.

Then, a NOR gate NR3 of the logical operation unit 601 receives at respective input terminals thereof the high level signal DS1 and the low level signal DS2 respectively from the signal delays 300 and 400, NORing the high level signal DS1 and the low level signal DS2 to output a low level signal, while a NOR gate NR4 receives at first and second input terminals thereof the high level signal LAS1 and the low level signal LAS2 respectively from the NOR gates NR1 and NR2 and at a third input terminal thereof the low level signal from the NOR gate NR3, NORing the signal LAS1 and LAS2 and the latter low level signal, to output a low level delay signal DS3.

Accordingly, the NOR gate NR1 receives at the second and the third input terminals thereof the low level signals DS2 and DS3 respectively from the delay 400 and the NOR gate NR4, NORing the low level signals DS2 and DS3 with the low level signal applied to the first input terminal thereof, to output a high level signal LAS1, while the NOR gate NR2 receives at the second and third input terminals thereof the high level signal DS1 and the low level signal DS3 respectively from the signal delay 300 and the NOR gate NR4, NORing the high level signal DS1 and the low level signal DS3 with the high level signal applied to the first input terminal thereof, to output the low level signal LAS2.

In the meantime, assuming that the low level signal LAS1 is outputted from the NOR gate NR2, the signal delays 300 and 400 delay the low level signals LAS1 and LAS2 respectively provided from the NOR gates NR1 and NR2 for a predetermined time so as to output the low level signals DS1 and DS2.

Accordingly, the NOR gate NR3 receives at respective input terminals thereof the low level signals DS1 and DS2 respectively from the signal delays 300 and 400, NORing the low level signals DS1 and DS2, to output a high level signal, while the NOR gate NR4 receives at the first and second input terminals thereof the low level signals LAS1 and LAS2 respectively from the NOR gates NR1 and NR2 and at the third input terminal thereof the high level signal from the NOR gate NR3 so as to output a low level signal DS3.

Accordingly, the NOR gate NR1 receives at the first and second input terminals the low level signals DS2 and DS3 respectively from the delay 400 and the NOR gate NR4, NORing the low level signals DS2 and DS3 with the low level signal applied to the first input terminal thereof, to output a high level signal LAS1, while the NOR gate NR2 receives at the second and third input terminals thereof the low level signals DS1 and DS3 respectively from the signal delay 300 and the NOR gate NR4, NORing the low level signals DS1 and DS3 with the high level signal applied to the first input terminal thereof, to output a low level signal LAS2.

Therefore, the high level signal LAS1 is outputted from the NOR gate NR1.

Accordingly, the high level signal LAS1 and the low level signal LAS2 respectively provided from the NOR gates NR1 and NR2 are delayed respectively by the signal delays 300 and 400 to be outputted as the high level signal DS1 and the low level signal DS2, respectively.

Therefore, the PMOS transistor Q1 and the NMOS transistor Q3 commonly receive at their gates the high level signal LAS1 from the NOR gate NR1 so as to thereby be turned off and turned on respectively, and the PMOS transistor Q2 and the NMOS transistor Q8 receive at their gates the low level signal LAS2 from the NOR gate NR2 so as to thereby be turned off and turned on, respectively, while the NMOS transistor Q4 and the PMOS transistor Q6 receive at each gate thereof the low level signal DS2 from the signal delay 400 so as to thereby be turned off and turned on, respectively.

In the meantime, the PMOS transistor Q5 and the NMOS transistor Q7 commonly receive at their gates the high level signal DS1 from the signal delay 300 so as to thereby be turned off and turned on, respectively, so that a low level signal ATD is outputted through the address transition detect signal ATD line.

Thereafter, as shown in FIGS. 5A and 5B, when a low level chip select signal CSb and a high level address signal ADS2 having a pulse width "a" smaller than one-half of the pulse width "Z" of an address transition detect signal as shown in FIG. 5C required for operating the memory device are inputted, the NOR gate 100 outputs a low level signal after NORing the input signals CSb and ADS1.

Then, the NOR gate NR1 receives at the first input terminal thereof a high level signal through the inverter 201 and at the second and third input terminals thereof the low level signals DS2 and DS3 respectively from the signal delay 400 and the NOR gate NR4, to output a low level signal LAS1, while the NOR gate NR2 receives at the first input terminal thereof the low level signal from the NOR gate 100 and at the second and third input terminals thereof the high level signal DS1 and the low level signal DS3 respectively from the signal delay 300 and the NOR gate NR4 in the logical operation unit 602 of the delay unit 600, NORing the former low level signal and the signals DS1 and DS2, to output a low level signal LAS2.

Accordingly, the PMOS transistor Q1 and the NMOS transistor Q3 commonly receive at their gates the low level signal LAS1 from the NOR gate NR1 so as to thereby be turned on and turned off, respectively, while the PMOS transistors Q2, Q5 and Q6 and the NMOS transistors Q4, Q7 and Q8 are maintained at their immediately preceding switched conditions, so that the low level signal ATD provided through the address transition detect signal ATD line is transitted to be output as a high level signal ATD.

At this time, the NOR gate NR3 receives at respective input terminals thereof the high level signal DS1 and the low level signal DS2 respectively from the signal delays 300 and 400, NORing the high and the low level signals DS1 and DS2, to output a low level signal, while the NOR gate NR4 receives at the first and third input terminals thereof the low level signals LAS1 and DS3 respectively from the NOR gates NR1 and NR4, NORing the low level signals LAS1 and DS3 with the low level signal LAS2 applied to the second input terminal thereof, to output a high level signal DS3.

Accordingly, the NOR gate NR1 receives at the third input terminal thereof the high level signal DS3 from the NOR gate NR4, NORing the high level signal DS3 with the high level signal from inverter 201 and the low level signal DS2 respectively applied to the first and second input terminals thereof, to output a low level signal LAS1, while the NOR gate NR2 receives at the third input terminal thereof the high level signal DS3 from the NOR gate NR4, NORing the high level signal DS3 with the low level signal from the NOR gate 100 and the high level signal DS1 respectively applied to the first and second input terminals thereof, to output a low level signal LAS2.

Accordingly, the high level signal ATD is continuously outputted through the address transition detect signal ATD line.

Thereafter, when the low level signal LAS1 provided from the NOR gate NR1 is outputted as a low level delayed signal DS1, the PMOS transistor Q5 and the NMOS transistor Q7 receive at their gates the outputted low level signal DS1 so as to thereby be turned on and turned off, respectively, while the PMOS transistors Q1, Q2 and Q6 and the NMOS transistors Q3, Q4 and Q8 are maintained at their immediately preceding switched conditions, so that the high level signal ATD is continuously outputted through the address transition detect signal ATD line.

At this time, the NOR gate NR3 receives at one input terminal thereof the low level signal DS1 from the signal delay 300, NORing the low level signal DS1 with the low level signal DS1 applied to the other input terminal thereof, to output a high level signal, while the NOR gate NR4 receives at the third input terminal thereof the high level signal from the NOR gate NR3, NORing the high level signal with the low level signals LAS1 and LAS2 respectively applied to the first and second input terminals thereof, to output a low level signal DS3.

Accordingly, the NOR gate NR1 receives at the third input terminal thereof the low level signal DS3 from the NOR gate NR4, NORing the low level signal DS3 with the high level signal from inverter 201 and the low level signal DS2 respectively applied to the first and second input terminals thereof, to output a low level signal LAS1, while the NOR gate NR2 receives at the second input terminal thereof the low level signal DS1 from the signal delay 300 and at the third input terminal thereof the low level signal DS3 from the NOR gate NR4, NORing the low level signals DS1 and DS3 with the low level signal from NOR gate 100 applied to the first input terminal thereof, to output a high level signal LAS2.

Then, the PMOS transistor Q2 and the NMOS transistor Q8 receive at their gates the high level signal LAS2 from the NOR gate NR2 so as to thereby be turned off and turned on, respectively, while the PMOS transistors Q1, Q5 and Q6 and the NMOS transistors Q3, Q4 and Q7 are maintained at their immediately preceding switched conditions, so that the high level signal ATD is continuously outputted through the address transition detect signal ATD line.

At this time, the NOR gate NR3 outputs the high level signal after NANDing the low level signals DS1 and DS2 respectively applied to the input terminals thereof, while the NOR gate NR4 receives at the second and third input terminals thereof the high level signal LAS2 and the high level signal respectively from the NOR gates NR2 and NR3, NORing the high level signal LAS2 and the latter high level signal with the low level signal LAS1 applied to the first input terminal thereof, to output a low level signal DS3.

Therefore, the NOR gate NR1 receives at the third input terminal thereof the low level signal DS3 from the NOR gate NR4, NORing the low level signal DS3 with the high level signal from inverter 201 and the low level signal DS2 respectively applied to the first and second input terminals thereof, to output the low level signal LAS1, while the NOR gate NR2 receives at the third input terminal thereof the low level signal DS3 from the NOR gate NR4, NANDing the low level signal DS3 with the low level signal from NOR gate 100 and the low level signal DS1 respectively applied to the first and second input terminals thereof, to output a high level signal LAS2.

Accordingly, the high level signal ATD is continuously outputted through the address transition detect signal ATD line.

Thereafter, when the high level signal LAS2 provided from the NOR gate NR2 is delayed by the delay unit 400 to be outputted as a high level signal DS2, the PMOS transistor Q4 and the NMOS transistor Q6 each receive at their gates the high level signal DS2 so as to thereby be turned on and mined off, respectively, while the PMOS transistors Q1, Q2 and Q5 and the NMOS transistors Q3, Q7 and Q8 are maintained at their immediately preceding switched conditions, so that a low level signal ATD is outputted through the address transition detect signal ATD line.

Accordingly, when the high level address signal ADS2 having a pulse width "a" as shown in FIG. 5B is inputted to the address transition detection circuit, a high level address transition detect signal ATD having a pulse width "Z" as shown in FIG. 5C is outputted.

On the other hand, as shown in FIG. 5B, under the condition that the low level address signal ADS1 is transitted to a high level address signal ADS3, when a pulse width "b" of the high level address signal ADS3 as transitted is larger than one-half of the pulse width "Z" of the address transition detect signal ATD required for operating the memory device but smaller than the pulse width "Z" of the address transition detect signal ATD, the high level address signal ADS3 having the pulse width "b" is inputted, by which when a low level chip select signal CSTb as shown in FIG. 5A is inputted, the address transition detection circuit is operated in the same way as described above, so that, as shown in FIG. 5C, a high level address transition detect signal ATD is outputted having a pulse width "Z+b" by adding the pulse width "b" of the input address signal ADS3 and to the pulse width "Z" of the address transition detect signal ATD required for operating the memory device.

In the meantime, as shown in FIG. 5B, under the condition that the low level address signal ADS1 is transitted to a high level address signal ADS4, when a pulse width "c" of the transitted address signal ADS4 is larger than the pulse width "Z" of the address transition detect signal ATD required for operating the memory device, the address signal ADS4 having the pulse width "c" is inputted, by which when a low level chip select signal CSTb as shown in FIG. 5A is inputted, the address transition detection circuit is operated in the same way as described above, so that a high level address transition detect signal ATD having the pulse width "Z" as shown in FIG. 5C is outputted.

Thereafter, when the high level address signal ADS4 is transitted to a low level address signal ADS5 to be inputted and the chip select signal CSTb is inputted at a low level, the NOR gate 100 outputs a high level signal after NORing the input signals ADS5 and CSTb.

Then, the NOR gate NR1 receives at the first input terminal thereof the low level signal inverted by the inverter 201, NORing the low level signal with the high level signal DS2 and the low level signal DS3 respectively applied to the second and third input terminals thereof, to output a low level signal LAS1, while the NOR gate NR2 receives at the first input terminal thereof the high level signal from the NOR gate 100, NORing the high level signal with the low level signals DS1 and DS3 respectively applied to the second and third input terminals thereof, to output a low level signal LAS2.

Accordingly, the PMOS transistor Q2 and the NMOS transistor Q8 each receive at their gates the low level signal LAS2 from the NOR gate NR2 so as to thereby be turned on and turned off, respectively, while the PMOS transistors Q1, Q5 and Q6 and the NMOS transistors Q3, Q4 and Q7 are maintained at their immediately preceding switched conditions, so that the low level address signal ATD provided therefrom is transitted to be output as a high level signal.

At this time, the NOR gate NR3 receives at respective input terminals thereof the low level signal DS1 and the high level signal DS2, NORing them, to output a low level signal, while the NOR gate NR4 receives at the second input terminal thereof the low level signal LAS2 provided from the NOR gate NR2 and at the third input terminal thereof the low level signal from the NOR gate NR3, NORing the low level signal LAS2 and the latter low level signal with the low level signal LAS1 applied to the first input terminal thereof, to output a high level signal DS3.

Accordingly, the NOR gate NR1 receives at the third input terminal thereof the high level signal DS3 from the NOR gate NR4, NORing the high level signal DS3 with the low level signal from inverter 201 and the high level signal DS2 respectively applied to the first and second input terminals thereof, to output a low level signal LAS1, while the NOR gate NR2 receives at the third input terminal thereof the high level signal DS3 from the NOR gate NR4, NORing the high level signal DS3 with the high level signal from NOR gate 100 and the low level signal DS1 respectively applied to the first and second input terminals thereof, to output a low level signal LAS2.

Therefore, the high level signal ATD is continuously outputted through the address transition detect signal ATD line.

Thereafter, when the low level signal LAS2 provided from the NOR gate NR2 is delayed by the signal delay 400 to be outputted as a low level signal DS2, the NMOS transistor Q4 and the PMOS transistor Q6 receive at their gates the outputted low level signal DS2 so as to be thereby turned off and turned on, respectively, while the PMOS transistors Q1, Q2 and Q5 and the NMOS transistors Q3, Q7 and Q8 are maintained at their immediately preceding switched conditions, so that the high level signal ATD is continuously outputted through the address transition detect signal ATD line.

At this time, the NOR gate NR3 receives at the second input terminal thereof the low level signal DS2 from the signal delay 400, NORing the low level signal DS2 with the low level signal DS1 applied to the first input terminal thereof, to output a high level signal, while the NOR gate NR4 receives at the third input terminal thereof the high level signal from the NOR gate NR3, NORing the high level signal with the low level signals LAS1 and LAS2 respectively applied to the first and second input terminals thereof, to output a low level signal DS3.

Accordingly, the NOR gate NR1 receives at the second input terminal thereof the low level signal DS2 from the signal delay 400 and at the third input terminal thereof the low level signal DS3 from the NOR gate NR4, NORing the low level signals DS2 and DS3 with the low level signal from inverter 201 applied to the first input terminal thereof, to output a high level signal LAS1, while the NOR gate NR2 receives at the third input terminal thereof the low level signal DS3 from the NOR gate NR4, NORing the low level signal DS3 with the high level signal from NOR gate 100 and the low level signal DS1 respectively applied to the first and second input terminals thereof, to output a low level signal LAS2.

Accordingly, the PMOS transistor Q1 and the NMOS transistor Q3 commonly receive at their gates the high level signal LAS1 from the NOR gate NR1 so as to thereby be turned off and turned on, respectively, while the PMOS transistors Q1, Q5 and Q6 and the NMOS transistors Q4, Q7 and Q8 are maintained at their immediately preceding switched conditions, so that the high level address transition detect signal ATD is continuously outputted through the address transition detect signal ATD line.

Thereafter, when the high level signal LAS1 provided from the NOR gate NR1 is delayed by the signal delay 300 to be outputted as a high level signal DS1, the PMOS transistor Q5 and the NMOS transistor Q7 receive at their gates the outputted high level signal DS1 so as to thereby be turned off and turned on, respectively, while the PMOS transistors Q1, Q2 and Q6 and the NMOS transistors Q3, Q4 and Q8 are maintained at their immediately preceding switched conditions, so that the high level address transition detect signal ATD being provided from the address transition detect signal ATD line is transitted to be output as a low level signal ATD.

Therefore, when the address signal ADS4 having the pulse width "c" as shown in FIG. 5B is inputted to the address transition detection circuit, the two address transition detect signals ATD each having the pulse width "Z" as shown in FIG. 5C are outputted.

Figure 6:
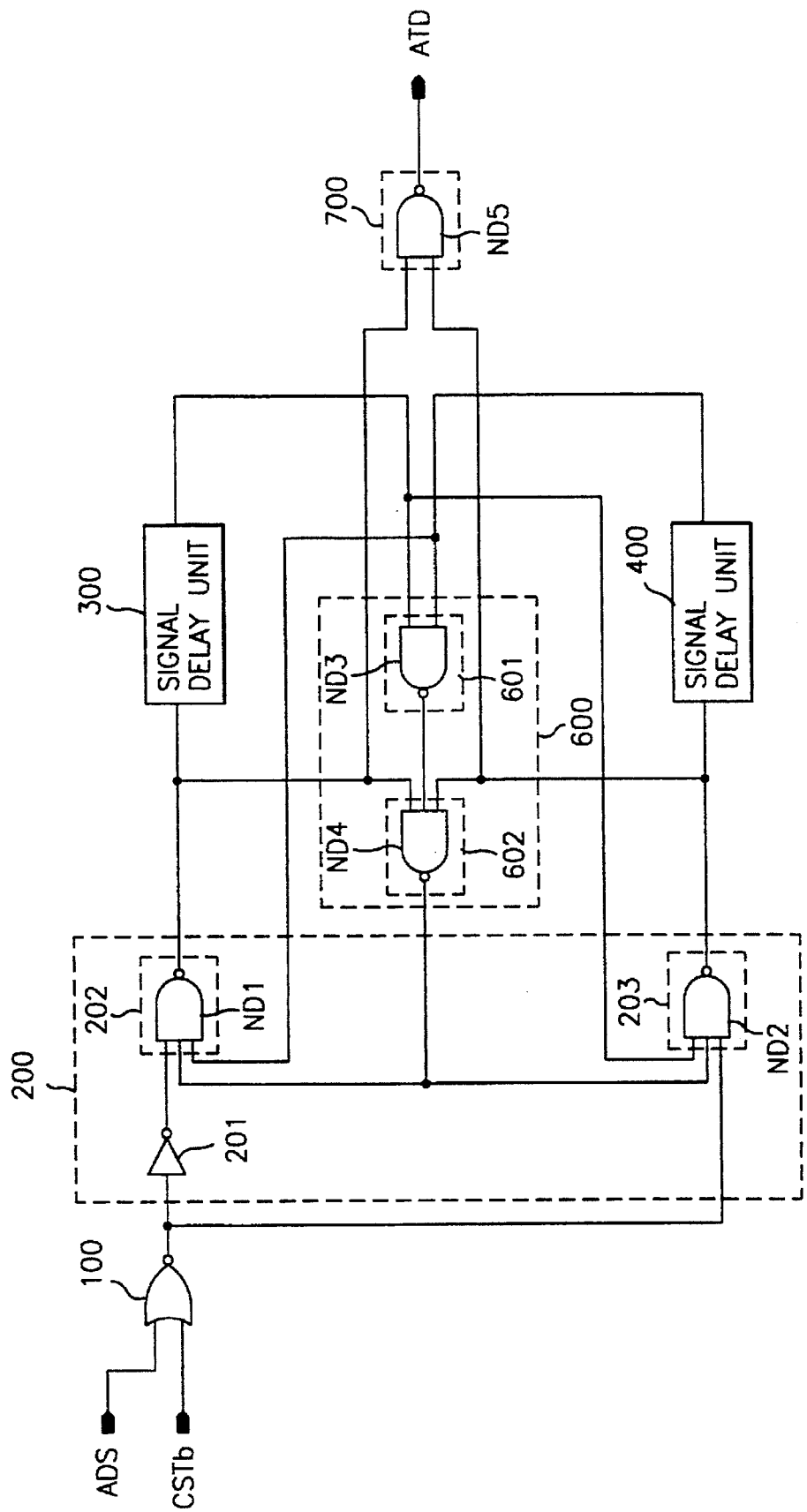
FIG. 6 is a circuit diagram showing an address transition detection circuit for a memory device according to still another embodiment of the present invention.

With reference to FIG. 6, an address transition detection circuit for a memory device according to still another embodiment of the present invention includes a NOR gate 100 constructed in the same way as in the first and second embodiments described above: a latch 200 including an inverter 201 and logical operation units 202 and 203: signal delays 300 and 400: a signal delay 600 including logical operation units 601 and 602: and a logical operation unit 700, in place of the signal output unit 600 of the first and second embodiments, for logically operating latch signals LAS1 and LAS2 respectively provided from the latch 200 and outputting an address transition detect signal ATD.

The logical operation unit 700 includes a NAND gate ND5 for NANDing the latch signals LAS1 and LAS2 respectively provided from the latch 200.

The logical operation units 201 and 202 include NAND gates ND1 and ND2, respectively, and the logical operation units 601 and 602 include the NAND gates ND3 and ND4, respectively.

The operation of the address transition detection circuit for the memory device according to this third embodiment of the present invention as constructed above will now be described in detail with reference to FIGS. 7A to 7C.

First, at an initial stage, when a low level chip select signal CSTb as shown in FIG. 7A and a low level address signal ADS1 as shown in FIG. 7B are inputted, the NOR gate 100 outputs a high level signal, while the NAND gates ND1 and ND2 output a high level signal LAS1 and a low level signal LAS2, respectively, likewise as in the previously described first embodiment.

Accordingly, the NAND gate ND5 of the logical operation unit 700 receives at both terminals thereof the high level signal LAS1 and the low level signal LAS2 respectively from the NAND gates ND1 and ND2, NANDing them, to output a high level signal ATD.

In the meantime, the high level signal LAS1 and the low level signal LAS2 respectively provided from the NAND gates ND1 and ND2 are delayed respectively by the signal delays 300 and 400 to be outputted respectively as a high level signal DS1 and a low level signal DS2.

Then, the NAND gate ND3 receives at respective input terminals thereof the high level signal DS1 and the low level signal DS2 respectively from the signal delays 300 and 400, NANDing them, to output a high level signal, while the NAND gate ND4 receives at first and second input terminals thereof the high level signal LAS1 and the low level signal LAS2 respectively from the NAND gates ND1 and ND2 and at a third input terminal thereof the high level signal from the NAND gate ND3, NANDing the signals LAS1 and the LAS2 and the latter high level signal, to output a high level signal DS3.

Accordingly, the NAND gate ND1 receives at second and third input terminals thereof the low level signal DS2 and the high level signal DS3 respectively from the signal delay 400 and the NAND gate ND4, NANDing the low level signal DS2 and the high level signal DS3 with the low level signal from inverter 201 applied to a first input terminal thereof, to output a high level signal LAS1, while the NAND gate ND2 receives at second and third input terminals thereof the high level signals DS1 and DS3 respectively from the signal delay 300 and the NAND gate ND4, NANDing the high level signals DS1 and DS3 with the high level signal from NOR gate 100 applied to a first input terminal thereof, to output a low level signal LAS2.

Therefore, the high level signal LAS1 and the low level signal LAS2 are applied to the NAND gate ND5 which NANDs these signals and accordingly the high level signal ATD is continuously outputted from the NAND gate ND5.

Thereafter, as shown in FIG. 7B, when the pulse width "A" of a high level address signal ADS(2) is smaller than a pulse width "Z" of an address transition detect signal required for operating the memory device as shown in FIG. 7C, the high level address signal ADS(2) having the pulse width "A" is inputted, by which when a low level chip select signal CSTb as shown in FIG. 7A is inputted, the NOR gate 100 outputs a low level signal after NORing the input signals ADS(2) and CSTb.

Then, the NAND gate ND1 receives at the first input terminal thereof a high level signal inverted through the inverter 201, NANDing the high level signal with the low level signal DS2 and the high level signal DS3 respectively applied to the second and third input terminals thereof, to output the high level signal LAS1, while the NAND gate ND2 receives at the first input terminal thereof the low level signal from the NOR gate 100, NANDing the low level signal with the high level signals DS1 and DS3 respectively applied to the second and third input terminals thereof, to output the high level signal LAS2.

The NAND gate ND5 receives at the respective input terminals thereof the high level signals LAS1 and LAS2 respectively from the NAND gates ND1 and ND2, NANDing them, to output a low level signal ATD (i.e., "ATD" transits to low level).

At this time, the NAND gate ND3 outputs a high level signal after NANDing the high level signal DS1 and the low level signal DS2 applied to the respective input terminals thereof, while the NAND gate ND4 receives at the second input terminal thereof the high level signal LAS2 from the NAND gate ND2 and at the third input terminal thereof the high level signal from the NAND gate ND3, NANDing the high level signal LAS2 and the latter high level signal with the high level signal LAS1 applied to the first input terminal thereof, to output a low level signal DS3.

Accordingly, the NAND gate ND1 receives at the third input terminal thereof the low level signal DS3 from the NAND gate ND4, NANDing the low level signal DS3 with the high level signal from inverter 201 and the low level signal DS2 respectively applied to the first and second input terminals thereof, to output a high level signal LAS1, while the NAND gate ND2 receives at the third input terminal thereof the low level signal DS3 from the NAND gate ND4, NANDing the low level signal DS3 with the low level signal from NOR gate 100 and the high level signal DS1 respectively applied to the first and second input terminals thereof, to output a high level signal LAS2.

Therefore, the NAND gate ND5 receives at the respective input terminals thereof the high level signals LAS1 and LAS2 respectively provided from the NAND gates ND1 and ND2, NANDing them to continuously output a low level signal ATD.

Thereafter, when the high level signal LAS2 provided from the NAND gate ND2 is delayed through the signal delay 400 to be outputted as a high level signal DS2 through the signal delay 400, the NAND gate ND3 receives at the one input terminal thereof the outputted high level signal DS2, NANDing the high level signal DS2 with the high level signal DS1 applied to the other input terminal thereof, to output a low level signal, while the NAND gate ND4 receives at the third input terminal thereof the low level signal from the NAND gate ND3, NANDing the low level signal with the high level signals LAS1 and LAS2 respectively applied to the first and second input terminals thereof, to output a high level signal DS3.

Accordingly, the NAND gate ND1 in logical operation unit 202 receives at the second input terminal thereof the high level signal DS2 from the signal delay 400 and at the third input terminal thereof the high level signal DS3 from the NAND gate ND4, NANDing the high level signals DS2 and DS3 with the high level signal from inverter 201 applied to the first input terminal thereof, to output a low level signal LAS1, while the NAND gate ND2 receives at the third input terminal thereof the high level signal DS3 from the NAND gate ND4, NANDing the high level signal DS3 with the low level signal from NOR gate 100 and the high level signal DS1 respectively applied to the first and second input terminals thereof, to output a high level signal DS2.

Therefore, the NAND gate ND5 receives at one input terminal thereof the low level signal LAS1 from the NAND gate ND1, NANDing the low level signal LAS1 with the high level signal LAS2 applied to the other input terminal thereof, to output a high level signal ATD (i.e., "ATD" transits from low to high).

Consequently, when the address signal ADS(2) having the pulse width "A" shown in FIG. 7(B) is inputted to the address transition detect circuit, the NAND gate ND5 outputs the low level address transition detect signal ATD having the pulse width "Z" required for operating the memory device as shown in FIG. 7C.

In the meantime, under the condition that the low level address signal ADS1 is transitted to a high level address signal ADS(3) as shown in FIG. 7B, when a pulse width "B" of the transitted address signal ADS(3) is larger than the pulse width "Z" of the ATD signal as shown in FIG. 7C required for operating the memory device, the high level address signal ADS(3) having the pulse width "B" is inputted, upon which when a low level chip select signal CSTb shown in FIG. 7A is inputted, the address transition detection circuit is operated in the same way as described above, so that the high level signal ATD having the low level pulse width "Z" as shown in FIG. 7C is outputted in response to the low to high level transition of the ADS(3) signal.

Thereafter, as shown in FIG. 7B, when the high level address signal ADS(3) is transitted to a low level address signal ADS(4) to be inputted to the NOR gate 100 and the low level chip select signal CSTb is inputted to the NOR gate 100, the NOR gate 100 outputs a high level signal after NORing the low level address signal ADS(4) and the low level chip select signal CSTb. Then, the NAND gate ND1 receives at the first input terminal thereof the low level signal inverted through the inverter 201, NANDing the low level signal with the high level signals DS2 and DS3 respectively applied to the second and third input terminals thereof, to output a high level signal LAS1.

The NAND gate ND2 receives at the first input terminal thereof the high level signal from the NOR gate 100, NANDing the high level signal with the low level signal DS1 and the high level signal DS3 respectively applied to the second and third input terminals thereof, to output a high level signal LAS2.

Accordingly, the NAND gate ND5 receives at respective input terminals thereof the high level signals LAS1 and LAS2 respectively from the NAND gates ND1 and ND2, NANDing them, to output a low level signal ATD (i.e., ATD transits from high to low level).

At this time, the NAND gate ND3 receives at respective input terminals thereof the low level signal DS1 and the high level signal DS2, NANDing them, to output a high level signal, while the NAND gate ND4 receives at the first and second input terminals thereof the high level signals LAS1 and LAS2 respectively from the NAND gates ND1 and ND2 and at the third input terminal thereof the high level signal from the NAND gate ND3, NANDing the high level signals LAS1 and LAS2 and the latter high level signal, to output a low level signal DS3.

Accordingly, the NAND gate ND1 receives at the third input terminal thereof the low level signal DS3 from the NAND gate ND4, NANDing the low level signal DS3 with the low level signal from inverter 201 and the high level signal DS2 respectively applied to the first and second input terminals thereof, to output a high level signal LAS1, while the NAND gate ND2 receives at the third input terminal thereof the low level signal DS3 from the NAND gate ND4, NANDing the low level signal DS3 with the high level signal from NOR gate 100 and the low level signal DS1 respectively applied to the first and second input terminals thereof, to output a high level signal LAS2.

Therefore, upon NANDing the high level signal LAS1 and LAS2 applied to NAND gate ND5, the low level signal ATD is continuously outputted from the NAND gate ND5.

Thereafter, when the high level signal LAS1 provided from the NAND gate ND1 is delayed through the signal delay 300 to be outputted as a high level signal DS1, the NAND gate ND3 receives at one input terminal thereof the outputted high level signal DS1, NANDing the high level signal DS1 with the high level signal DS2 from signal delay 400 applied to the other input terminal thereof, to output a low level signal, while the NAND gate ND4 receives at the third input terminal thereof the low level signal from the NAND gate ND3, NANDing the low level signal with the high level signals LAS1 and LAS2 respectively applied to the first and second input terminals thereof, to output a high level signal DS3.

Accordingly, the NAND gate ND1 receives at the third input terminal thereof the high level signal DS3 from the NAND gate ND4, NANDing the high level signal DS3 with the low level signal from inverter 201 and the high level signal DS2 from the signal delay 400 respectively applied to the first and second input terminals thereof, to output a high level signal LAS1, while the NAND gate ND2 receives at the second input terminal thereof the high level signal DS1 from the signal delay 300 and at the third input terminal thereof the high level signal DS3 from the NAND gate ND4, NANDing the high level signals DS1 and DS3 with the high level signal from NOR gate 100 applied to the first input terminal thereof, to output a low level signal.

Accordingly, the NAND gate ND5 receives at one input terminal thereof the low level signal LAS2 from the NAND gate ND2, NANDing the low level signal LAS2 with the high level signal LAS1 applied to the other input terminal thereof, to output a high level signal ATD (i.e., the signal ATD transits from low to high level).

Therefore, when the address signal ADS(3) having the pulse width "B" as shown in FIG. 7C is inputted, two low level address transition detect signals ATD each having the pulse width "Z" required for operating the memory device are outputted from the NAND gate ND5, as shown in FIG. 7C.

When the low level address signal ADS1 is transitted to a high level address signal ADS(3), the pulse width "Z" is determined relying on a delay time of the signal delays 400 and 600. In the meantime, when the high level address signal ADS(3) is transitted to a low level address signal ADS(4), the pulse width "Z" is determined relying on a delay time of the signal delays 300 and 600.

Figure 8:
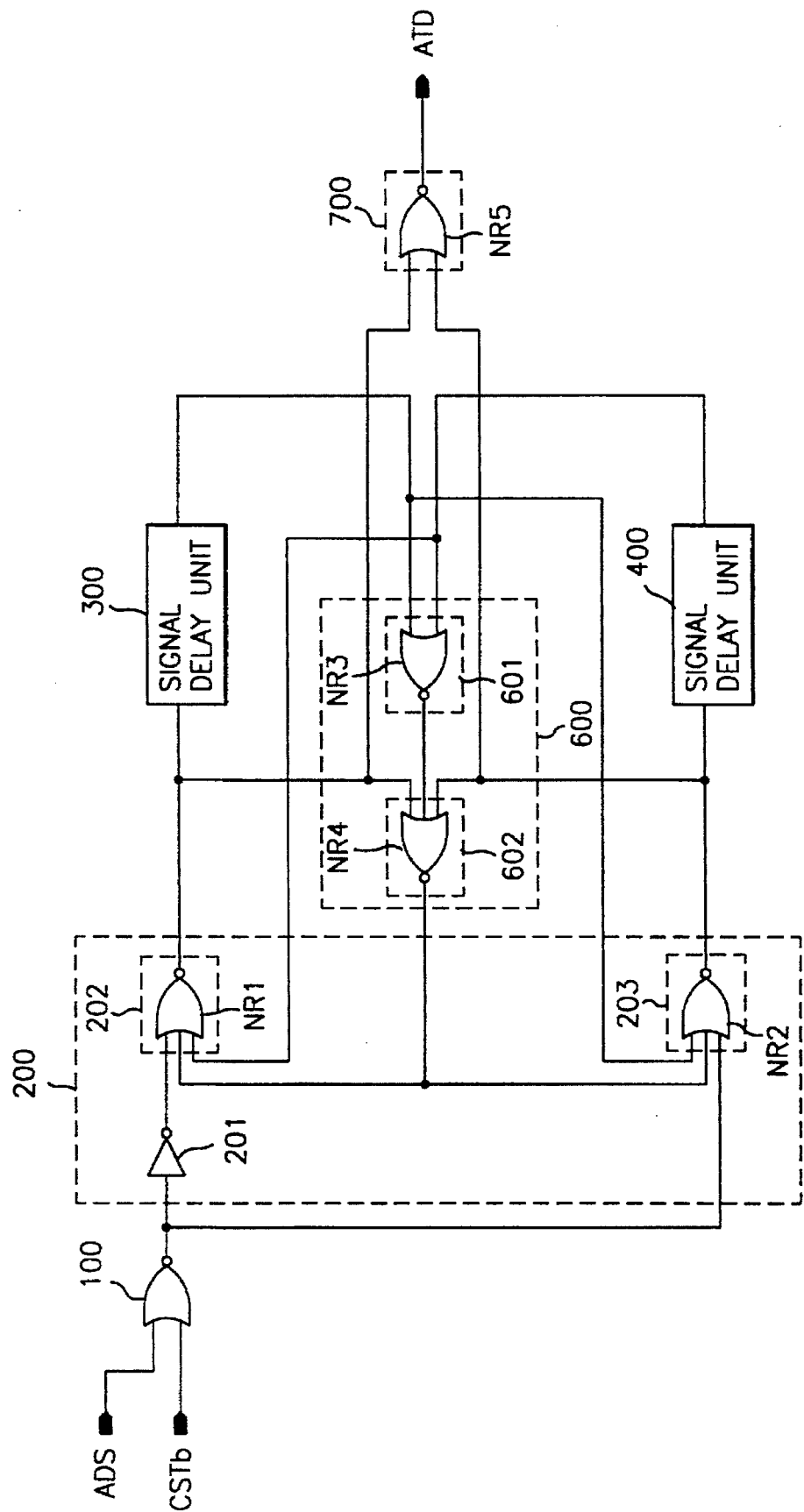
FIG. 8 is a circuit diagram showing an address transition detection circuit for a memory device according to still further embodiment of the present invention.

With reference to FIG. 8, an address transition detection circuit for a memory device according to a still further embodiment of the present invention includes a NOR gate 100; a latch 200 having an inverter 201 and logical operation units 202 and 203; signal delays 300 and 400; a signal delay 600 including logical operation units 601 and 602; and a logical operation unit 700, having the same construction as that of the third embodiment.

The logical operation unit 700 includes NOR gate NR5.

The logical operation units 202 and 203 include NOR gates NR1 and NR2, respectively, and the logical operation units 601 and 602 include NOR gates NR3 and NR4, respectively.

The operation of the address transition detection circuit for a memory device according to this fourth embodiment of the present invention will now be described in detail with reference to FIGS. 9A to 9C.

Figures 9A, 9B, 9C:
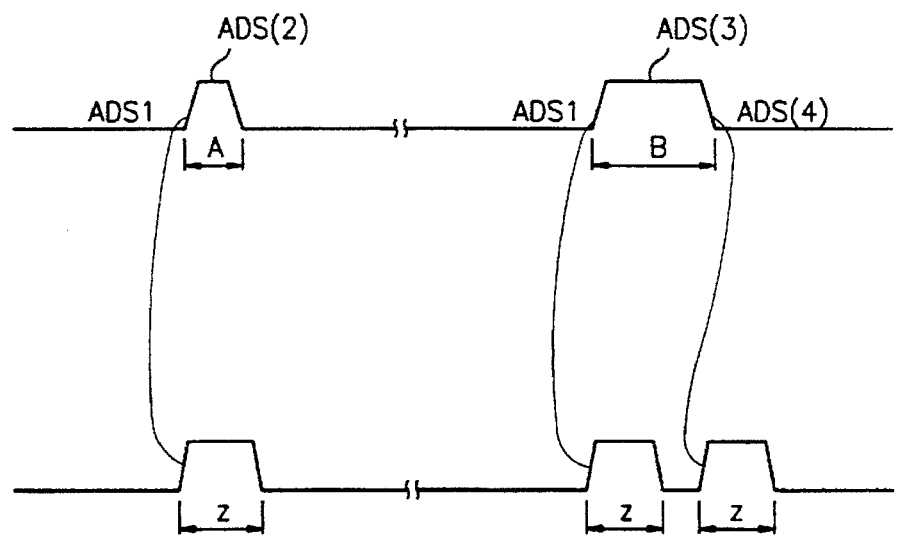
FIGS. 9A to 9C show input and output waveforms in each part of the circuit of FIG. 8.

First, at an initial stage, when a low level chip select signal CSTb as shown in FIG. 9A and a low level address signal ADS1 as shown in FIG. 9B are inputted to the NOR gate 100, the NOR gate 100 outputs a high level signal after NORing the low level chip select signal CSTb and the low level address signal ADS1. Then, the NOR gate NR1 receives at a first input terminal thereof the low level signal inverted through the inverter 201, to output a high level signal LAS1 according to the states of the signals DS2 and DS3 respectively applied to its second and third input terminals as previously described, while the NOR gate NR2 receives at a first input terminal thereof the high level signal from the NOR gate 100 and outputs a low level signal LAS2 regardless of the states of the signals DS1 and DS3 respectively applied to second and third input terminals thereof.

Accordingly, the NOR gate NR5 receives at the respective input terminals thereof the high level signal LAS1 and the low level signal LAS2 respectively provided from the NOR gates NR1 and NR2, NORing them, to output a low level signal ATD.

In the meantime, the high level signals LAS1 and LAS2 respectively provided from the NOR gates NR1 and NR2 are delayed respectively through the signal delays 300 and 400 to be outputted as a high level signal DS1 and a low level signal DS2, respectively.

Accordingly, the NOR gate NR3 receives at the respective input terminals thereof the high level signals DS1 and DS2 respectively from the signal delays 300 and 400, NORing them to output a low level signal, while the NOR gate NR4 receives at first and second input terminals thereof the high level signal LAS1 and the low level signal LAS2 respectively from the NOR gates NR1 and NR2 and at a third input terminal thereof the low level signal from the NOR gate NR3, NORing the high level signal LAS1, the low level signal LAS2 and the latter low level signal, to output a low level signal DS3.

Then, the NOR gate NR1 receives at the second and the third input terminals thereof the low level signals DS2 and DS3 respectively from the signal delay 400 and the NOR gate NR4, NORing the low level signals DS2 and DS3 with a low level signal from inverter 201 applied to the first input terminal thereof, to output a high level signal LAS1, while the NOR gate NR2 receives at the second and third input terminals thereof the high level signal DS1 and the low level signal DS3 respectively from the signal delay 300 and the NOR gate NR4, NORing the high level signal DS1 and the low level signal DS3 with the high level signal from NOR gate 100 applied to the first input terminal thereof, to output a low level signal LAS2.

Therefore, as the high level signal LAS1 and the low level signal LAS2 are NORed by NOR gate NR5, the low level signal ATD is continuously outputted from the NOR gate NR5.

Thereafter, as shown in FIGS. 9B and 9C, under the condition that the low level address signal ADS1 is transitted to a high level address signal ADS(2), if a pulse width "A" of the transitted address signal ADS(2) is shorter than a pulse width "Z" of the address transition detect signal required for operating the memory device, the high level address signal ADS(2) having the pulse width "A" is inputted, upon which when a low level chip select signal CSTb is inputted, the input signals ADS(2) and CSTb are NORed through the NOR gate 100 which outputs a low level signal.

Then, the NOR gate NR1 receives at the first input terminal thereof the high level signal inverted through the inverter 201, NORing this high level signal with the low level signals DS2 and DS3 respectively applied to the second and third input terminals thereof, to output a low level signal LAS1, while the NOR gate NR2 receives at the first input terminal thereof the low level signal from the NOR gate 100, NORing this low level signal with the high level signal DS1 and the low level signal DS3 respectively applied to the second and third input terminals thereof, to output a low level signal LAS2.

Accordingly, the NOR gate NR5 receives at one input terminal thereof the low level signal LAS1 from the NOR gate NR1, NORing the low level signal LAS1 with the low level signal LAS2 applied to the other input terminal thereof, to output a high level signal ATD (i.e., the signal ATD transits from low to high).

At this time, the NOR gate NR3 outputs the low level signal after NORing the high level signal DS1 and the low level signal DS2 respectively applied to the input terminals thereof, while the NOR gate NR4 receives at the first input terminal thereof the low level signal LAS1 from the NOR gate NR1 and at the third input terminal thereof the low level signal from the NOR gate NR3, NORing the low level signal LAS1 and the low level signal from NOR gate NR3 with the low level signal LAS2 applied to the second input terminal thereof, to output a high level signal DS3.

Accordingly, the NOR gate NR1 receives at the third input terminal thereof the high level signal DS3 from the NOR gate NR4, NORing it with the high level signal from inverter 201 and the low level signal DS2 respectively applied to the first and second input terminals thereof, to output a low level signal LAS1, while the NOR gate NR2 receives at the third input terminal thereof the high level signal DS3 from the NOR gate NR4, NORing the high level signal DS3 with the low level signal from NOR gate 100 and the high level signal DS1 respectively applied to the first and second input terminals thereof, to output a low level signal LAS2.

Therefore, as the low level signals LAS1 and LAS2 are applied to NOR gate NR5, the high level signal ATD is continuously outputted from the NOR gate NR5.

Thereafter, when the low level signal LAS1 provided from the NOR gate NR1 is delayed through the signal delay 300 to be outputted as a low level signal DS1 and when the low level signal LAS2 is delayed through the signal delay 400 to be outputted as a low level signal DS2, the NOR gate NR3 receives at one input terminal thereof the outputted low level signal DS1, NORing it with the low level signal DS2 applied to the other input terminal thereof, to output a high level signal, while the NOR gate NR4 receives at the third input terminal thereof the high level signal from the NOR gate NR3, NORing it with the low level signals LAS1 and LAS2 respectively applied to the first and second input terminals thereof, to output a low level signal DS3.

Accordingly, the NOR gate NR1 receives at the third input terminal thereof the low level signal DS3 from the NOR gate NR4, NORing it with the high level signal from inverter 201 and the low level signal DS2 respectively applied to the first and second input terminals thereof, to output a low level signal LAS1, while the NOR gate NR2 receives at the second input terminal thereof the low level signal DS1 from the signal delay 300 and at the third input terminal thereof the low level signal DS3 from the NOR gate NR4, NORing the low level signals DS1 and DS3 with the low level signal from NOR gate 100 applied to the first input terminal thereof, to output a high level signal LAS2.

Therefore, the NOR gate NR5 receives at one input terminal thereof the high level signal LAS2 from the NOR gate NR2, NORing it with the low level signal LAS1 from NOR gate 1 applied to the other input terminal thereof, to output a low level signal ATD (i.e., the signal ATD transits from high to low).

Thereafter, when the high level signal LAS2 provided from the NOR gate NR2 is delayed through the signal delay 400 to be outputted as a high level signal DS2, the NOR gate NR3 receives at one input terminal thereof the outputted high level signal DS2, NORing it with the low level signal DS1 applied to the other input terminal thereof, to output a low level signal, while the NOR gate NR4 receives at the third input terminal thereof the low level signal from the NOR gate NR3, NORing it with the low level signals LAS1 and LAS2 respectively applied to the first and second input terminals thereof, to output a low level signal DS3.

Accordingly, the NOR gate NR1 receives at the second and third input terminals thereof the high level signal DS2 and the low level signal DS3 respectively from the delay 400 and the NOR gate NR4, NORing them with the high level signal from inverter 201, to output a low level signal LAS1, while the NOR gate NR2 receives at the third input terminal thereof the low level signal DS3 from the NOR gate NR4, NORing it with the low level signal from NOR gate 100 and the low level signal DS1 respectively applied to the first and second input terminals thereof, to output a high level signal LAS2.

Therefore, as the low level signal LAS1 and high level signal LAS2 are NORed by NOR gate NR5, the low level signal ATD is continuously outputted from the NOR gate NR5.

Consequently, when the address signal ADS(2) having the pulse width "A" as shown in FIG. 9B is inputted to the address transition detection circuit, the NOR gate NR5 outputs a single high level address transition detect signal ATD having the pulse width "Z" as shown in FIG. 9C.

In the meantime, as shown in FIG. 9B, under the condition that the low level address signal ADS1 is transitted to a high level address signal ADS(3), if a pulse width "B" of the transitted address signal ADS(3) is larger than the pulse width "Z" of the ATD signal as shown in FIG. 9C required for operating the memory device, the transitted address signal ADS(3) is inputted, upon which when a low level chip select signal CSTb as shown in FIG. 9A is inputted, the address transition detection circuit is operated in the same way as described above, so that a single high level address transition detect signal ATD having the pulse width "Z" and a single low level signal ATD as shown in FIG. 9C are sequentially outputted through the NOR gate NR5.

Thereafter, when the high level address signal ADS(3) is transitted to a low level address signal ADS(4) to be inputted to the NOR gate 100 and a low level chip select signal CSTb is inputted to the NOR gate 100, the NOR gate 100 outputs a high level signal after NORing them. Then, the NOR gate NR1 receives at the first input terminal thereof the low level signal inverted through the inverter 201, NORing it with the high level signal DS2 and the low level signal DS3 respectively applied to the second and third input terminals thereof, to output a low level signal LAS1.

And, the NOR gate NR2 receives at the first input terminal thereof the high level signal from the NOR gate 100, NORing it with the low level signals DS1 and DS3 respectively applied to the second and third input terminals thereof, to output a low level signal LAS2.

Accordingly, the NOR gate NR5 outputs the high level signal ATD after NORing the low level signals LAS1 and LAS2 respectively provided from the NOR gates NR1 and NR2.

At this time, the NOR gate NR3 outputs a low level signal after NORing the low level signals DS1 and DS2 respectively applied to the input terminals thereof, while the NOR gate NR4 receives at the first and second input terminals thereof the low level signals LAS1 and LAS2 from the NOR gates NR1 and NR2 and at the third input terminal thereof the low level signal from the NOR gate NR3 and outputs a high level signal DS3.

Accordingly, the NOR gate NR1 receives at the third input terminal thereof the high level signal DS3 from the NOR gate NR4, NORing it with the low level signal from inverter 201 and the high level signal DS2 respectively applied to the first and second input terminals thereof, to continuously output a low level signal LAS1, while the NOR gate NR2 receives at the third input terminal thereof the high level signal DS3 from the NOR gate NR4, NORing it with the high level signal from NOR gate 100 and the low level signal DS1 respectively applied to the first and second input terminals thereof, to output a low level signal LAS2.

Therefore, as the low level signals LAS1 and LAS2 are applied to NOR gate NR5, the high level signal ATD is continuously outputted from the NOR gate NR5.

Thereafter, when the low level signal LAS2 provided from the NOR gate NR2 is delayed through the signal delay 400 to be outputted as a low level signal DS2, the NOR gate NR3 receives at one input terminal thereof the outputted low level signal DS2, NORing it with the low level signal DS1 from signal delay 300 applied to the other input terminal thereof, to output a high level signal, while the NOR gate NR4 receives at the third input terminal thereof the high level signal from the NOR gate 601, NORing it with the low level signals LAS1 and LAS2 respectively applied to the first and second input terminals thereof, to output a low level signal DS3.

Accordingly, the NOR gate NR1 receives at the third input terminal thereof the low level signal DS3 from the NOR gate NR4; NORing it with the low level signal from inverter 201 and the low level signal DS2 respectively applied to the first and second input terminals thereof, to output a high level signal LAS1, while the NOR gate NR2 receives at the third input terminal thereof the low level signal DS3 from the NOR gate NR4, NORing it with the high level signal from NOR gate 100 and the low level signal DS1 respectively applied to the first and second input terminals thereof to output a low level signal LAS2.

Consequently, when the high level address signal ADS(3) having the pulse width "B" as shown in FIG. 9B is inputted to the address transition detection circuit, two high level address transition detect signals ATD each having the pulse width "Z" required for operating the memory device are sequentially outputted through the NOR gate NR5.

In the meantime, when the low level address signal ADS1 is transitted to a high level address signal ADS2, the pulse width "Z" is determined relying on a delay time of the signal delays 300 and 600, while when the high level address signal ADS(3) is transitted to a low level address signal ADS(4), the pulse width "Z" is determined relying on a delay time of the signal delays 400 and 600.

As so far described, in the address transition detection circuit for a memory device according to the four preferred embodiments of the present invention, the address transition detect signal required for operating the memory device is outputted regardless of the pulse width of the address signal provided to the memory device, to thereby prevent any malfunction of the memory device, so that the memory device can be reliably and stably operated.

What is claimed is:

1. An address transition detection circuit for a memory device comprising:

a NOR gate NORing an inputted address signal and an inputted chip select signal;

latch means for latching an output signal of the NOR gate in response to first through third delay signals to output first and second latch signals;

first and second signal delay means for respectively delaying the first and second latch signals provided from the latch means for a predetermined time to respectively output the first and second delay signals;

signal output means for outputting an address transition detect signal in response to the first and second latch signals respectively provided from the latch means and the first and second delay signals respectively provided from the first and second signal delay means; and third signal delay means for logically operating the first and second latch signals and the first and the second delay signals provided to the signal output means and outputting the third delay signal to the latch means.

2. The circuit according to claim 1, wherein the latch means includes first logical operating means for logically operating the output signal of the NOR gate inverted through an inverter and the second and third delay signals respectively provided from the second and third signal delay means; and second logical operation means for logically operating the output signal of the NOR gate and the first and third delay signals respectively provided from the first and third signal delay means.

3. The circuit according to claim 2, wherein the first logical operating means includes a NAND gate.

4. The circuit according to claim 2, wherein the first logical operating means includes a NOR gate.

5. The circuit according to claim 2, wherein the second logical operating means includes a NAND gate.

6. The circuit according to claim 2, wherein the second logical operating means includes a NOR gate.

7. The circuit according to claim 1, wherein the signal output means includes:

a first PMOS transistor having a source to which a power supply voltage terminal is connected and a gate to which a first delay signal output line of the first signal delay means is connected;

a second PMOS transistor having a source to which a drain of the first PMOS transistor is connected and a gate to which a first latch signal output line of the latch means is connected;

a first NMOS transistor having a drain to which a drain of the second PMOS transistor is connected so as to be commonly connected therewith to an address transition detect signal output line and a gate to which a second latch signal output line of the latch means is connected;

a second NMOS transistor having a drain to which a source of the first NMOS transistor is connected, a gate to which the gate of the second PMOS transistor is connected and a source connected to a ground voltage;

a third PMOS transistor having a source to which the power supply voltage terminal is connected and a gate to which a second delay signal output line of the second signal delay means is connected;

a fourth PMOS transistor having a source to which a drain of the third PMOS transistor is connected and a gate to which the gate of the first NMOS transistor is connected;

a third NMOS transistor having a drain to which a drain of the fourth PMOS transistor is connected so as to be commonly connected therewith to the address transition detect signal output line and a gate to which the gate of the third PMOS transistor is connected; and a fourth NMOS transistor having a drain to which a source of the third NMOS transistor is connected, a gate to which the gate of the first PMOS transistor is connected and a source connected to the ground voltage.

8. The circuit according to claim 1, wherein the signal output means includes:

a first PMOS transistor having a source to which a power supply voltage is applied and a gate to which a first latch signal output line of the latch means is connected;

a second PMOS transistor having a source to which a drain of the first PMOS transistor is connected and a gate to which a second latch signal output line of the latch means is connected;

a first NMOS transistor having a drain to which a drain of the second PMOS transistor is connected so as to be commonly connected therewith to an address transition detect signal output line, and a gate to which the gate of the first PMOS transistor is connected;

a second NMOS transistor having a drain to which a source of the first NMOS transistor is connected, a gate to which a second delay signal output line of the second signal delay means is connected, and a source connected to a ground voltage;

a third PMOS transistor having a source to which the power supply voltage is connected, and a gate to which a first delay signal output line of the first signal delay means is connected;

a fourth PMOS transistor having a source to which a drain of the third PMOS transistor is connected and a gate to which the gate of the second NMOS transistor is connected;

a third NMOS transistor having a drain to which a drain of the fourth PMOS transistor is connected so as to be commonly connected therewith to the address transition detect signal output line and a gate to which the gate of the third PMOS transistor is connected; and a fourth NMOS transistor having a drain to which a source of the third NMOS transistor is connected, a gate to which the gate of the second PMOS transistor is connected and a source connected to the ground voltage.

9. The circuit according to claim 1, wherein the third signal delay means includes:

a first logical operating means for logically operating the first and the second delay signals respectively provided from the first and the second signal delay means; and a second logical operating means for logically operating an output signal from the first logical operating means and the first and the second latch signals respectively provided from the latch means to output the third delay signal.

10. The circuit according to claim 9, wherein the first logical operating means includes a NAND gate.

11. The circuit according to claim 9, wherein the first logical operating means includes a NOR gate.

12. The circuit according to claim 9, wherein the second logical operating means includes a NAND gate.

13. The circuit according to claim 9, wherein the second logical operating means includes a NOR gate.

14. An address transition detection circuit for a memory device, comprising:

a NOR gate NORing an input address signal and an input chip select signal;

latch means for latching an output signal provided from the NOR gate in response to first to third delay signals to output first and second latch signals;

first and second delay means for respectively delaying the first and second latch signals provided from the latch means for a predetermined time to respectively output first and second delay signals;

logical operating means for logically operating the first and second latch signals provided from the latch means to output an address transition detect signal; and third delay means for logically operating the first and second latch signals provided to the logical operating means and the first and second delay signals respectively provided from the first and second delay means and outputting the third delay signal to the latch means.

15. The circuit according to claim 14, wherein the latch means includes:

first logical operating means for logically operating the output signal of the NOR gate inverted through an inverter and the second and third delay signals respectively provided from the second and third delay means; and second logical operating means for logically operating the output signal of the NOR gate and the first and third delay signals respectively provided from the first and third delay means.

16. The circuit according to claim 15, wherein the first logical operating means includes a NAND gate.

17. The circuit according to claim 15, wherein the first logical operating means includes a NOR gate.

18. The circuit according to claim 15, wherein the second logical operating means includes a NAND gate.

19. The circuit according to claim 15, wherein the second logical operating means includes a NOR gate.

20. The circuit according to claim 14, wherein the logical operating means includes a NAND gate.

21. The circuit according to claim 14, wherein the logical operating means includes a NOR gate.

22. The circuit according to claim 14, wherein the third delay means includes:

first logical operating means for logically operating the first and second delay signals respectively provided from the first and second delay means; and second logical operating means for logically operating an output signal of the first logical operating means and the first and the second latch signals respectively provided from the latch means.

23. The circuit according to claim 22, wherein the first logical operating means includes a NAND gate.

24. The circuit according to claim 22, wherein the first logical operating means includes a NOR gate.

25. The circuit according to claim 22, wherein the second logical operating means includes a NAND gate.

26. The circuit according to claim 22, wherein the second logical operating means includes a NOR gate.

* * * * *